United States Patent
Madigan et al.

(10) Patent No.: US 10,115,900 B2
(45) Date of Patent: Oct. 30, 2018

(54) SYSTEMS AND METHODS FOR THERMAL PROCESSING OF A SUBSTRATE

(71) Applicant: Kateeva, Inc., Newark, CA (US)

(72) Inventors: Conor F. Madigan, San Franciso, CA (US); Eliyahu Vronsky, Los Altos, CA (US); Alexander Sou-Kang Ko, Santa Clara, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/351,424

(22) Filed: Nov. 14, 2016

(65) Prior Publication Data

US 2017/0141310 A1    May 18, 2017

Related U.S. Application Data

(60) Provisional application No. 62/255,928, filed on Nov. 16, 2015.

(51) Int. Cl.
   *H01L 51/00* (2006.01)
   *H01L 51/56* (2006.01)

(52) U.S. Cl.
   CPC ...... *H01L 51/0004* (2013.01); *H01L 51/0026* (2013.01); *H01L 51/56* (2013.01)

(58) Field of Classification Search
   CPC . H01L 51/0004; H01L 51/0026; H01L 51/56; B05D 3/02
   USPC .......................................................... 438/46
   See application file for complete search history.

(56) References Cited

U.S. PATENT DOCUMENTS

| | | | |
|---|---|---|---|
| 4,788,447 A | 11/1988 | Kiyono et al. | |
| 5,788,447 A | 8/1998 | Yonemitsu et al. | |
| 6,228,171 B1 | 5/2001 | Shirakawa | |
| 7,037,810 B2 | 5/2006 | Hayashi | |
| 7,258,768 B2 | 8/2007 | Yamazaki | |
| 7,410,251 B2 | 8/2008 | Chung et al. | |
| 7,517,549 B2 | 4/2009 | Hayashi | |
| 7,635,244 B2 | 12/2009 | Sakiya | |
| 7,703,911 B2 | 4/2010 | Chung et al. | |
| 8,592,251 B2 | 11/2013 | Hosoba et al. | |
| 2002/0197145 A1 | 12/2002 | Yamamoto et al. | |
| 2004/0056915 A1* | 3/2004 | Miyazawa | B41J 2/16579 347/19 |

(Continued)

FOREIGN PATENT DOCUMENTS

| | | |
|---|---|---|
| JP | 2001326162 A | 11/2001 |
| JP | 2007095377 A | 4/2007 |

(Continued)

OTHER PUBLICATIONS

Office action Appendix A: Machine Translation into English of Oki JP 2007-175703-A from J-PLAT PAT dated Aug. 20, 2017.*

(Continued)

*Primary Examiner* — Johannes P Mondt
(74) *Attorney, Agent, or Firm* — Paula Tostado

(57) ABSTRACT

Various materials can be deposited on an OLED substrate at various steps, in which the materials may subsequently require drying, baking and a combination thereof. Given the critical nature of drying and baking steps, the inventors of the present teachings have designed various modules for carrying out drying and baking which can be used as a process development module, and additionally for as a dedicated process module in production.

25 Claims, 12 Drawing Sheets

(56) References Cited

U.S. PATENT DOCUMENTS

| | | |
|---|---|---|
| 2005/0140764 A1 | 6/2005 | Chang et al. |
| 2006/0057750 A1 | 3/2006 | Aoki et al. |
| 2008/0260938 A1* | 10/2008 | Ikeda ............... C23C 14/042 |
| | | 427/66 |
| 2008/0273072 A1 | 11/2008 | Chung et al. |
| 2009/0295857 A1 | 12/2009 | Kikuchi et al. |
| 2011/0305824 A1 | 12/2011 | Chesterfield et al. |
| 2012/0326139 A1 | 12/2012 | Chen |
| 2013/0005076 A1* | 1/2013 | Vronsky ............. B41J 2/14427 |
| | | 438/99 |
| 2013/0082263 A1 | 4/2013 | Honda et al. |
| 2013/0240844 A1 | 9/2013 | Nakatsuka et al. |
| 2013/0293621 A1 | 11/2013 | Tunmore et al. |
| 2017/0004983 A1 | 1/2017 | Madigan et al. |

FOREIGN PATENT DOCUMENTS

| | | | | |
|---|---|---|---|---|
| JP | 2007175703 A * | 7/2007 | ............ | B05D 3/02 |
| JP | 2007175703 A | 7/2007 | | |
| JP | 2011065967 A | 3/2011 | | |
| JP | 2011129275 A | 6/2011 | | |
| JP | 2014026764 A * | 2/2014 | ............ | H05B 33/10 |
| JP | 2014-199806 A * | 10/2014 | ............ | H05B 33/10 |
| JP | 2014199806 A | 10/2014 | | |
| JP | 2014221935 A * | 11/2014 | ............ | C23C 14/00 |
| JP | 2014221935 A | 11/2014 | | |
| KR | 100244041 B1 | 2/2000 | | |
| KR | 1020010015386 A | 2/2001 | | |
| WO | WO-2012001741 A1 * | 1/2012 | ......... | H01L 27/3246 |
| WO | 2014017194 A1 | 1/2014 | | |

OTHER PUBLICATIONS

Office actrion Appendix B: Machine Translation into English of Narishima et al JP 2014-026764-A from J-PLAT PAT dated Aug. 20, 2017.*
Office action Appendix C: Machine Translation into English of Shimamura et al JP 2014-199806-A from J-PLAT PAT dated Aug. 20, 2017.*
International Search Report and Written Opinion dated Apr. 3, 2015, to PCT Application PCT/US14/72263.
International Search Report dated Feb. 1, 2017 for PCT Application No. PCT/US16/61932.
MBRAUN HP Stack.
CN First Office Action dated Apr. 5, 2017 for CN Patent Application No. 80071004.7.
EP Extended Search Report dated May 4, 2017 for EP Patent Application No. 14873900.6.
Final Office action dated Mar. 1, 2018 to U.S. Appl. No. 15/106,907.
KR Provisional Rejection dated Aug. 28, 2017, to KR Patent Application No. 10-2016-7019863.
Non-Final Office Action dated Aug. 9, 2017 for U.S. Appl. No. 15/106,907.
Official Action dated Aug. 29, 2017 for Japanese Patent Application No. 2016-537494.
Second Office Action dated Feb. 6, 2018, to CN Patent Application No. 201480071004.7.

* cited by examiner

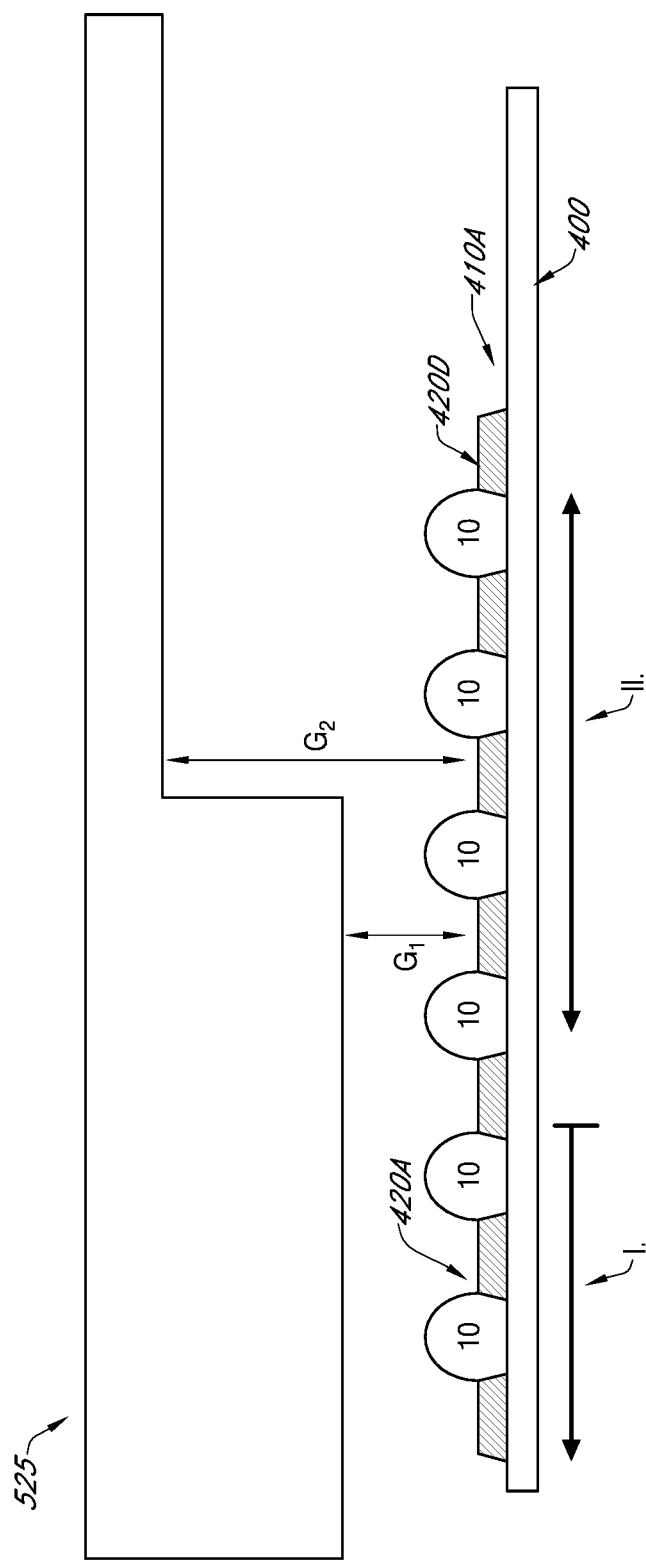

SYSTEMS AND METHODS FOR THERMAL PROCESSING OF A SUBSTRATE

CROSS-REFERENCE TO RELATED APPLICATIONS

This application claims benefit of U.S. 62/255,928, with a filing date of Nov. 16, 2015, which is incorporated in its entirety herein.

BACKGROUND

In processing a substrate, for example, but not limited by, for organic light emitting device (OLED) displays used in various cell phone and smart phone technologies, as well as for larger displays used for monitors and TV screens, various manufacturing steps for fabrication of such display technologies are used. In that regard, process development requires flexibility to support testing of what can be numerous variable in a process conditions in order to define specifications for any manufacturing process step in an overall manufacturing process.

For example, various materials can be deposited on an OLED substrate, in which the materials are dissolved or suspended in a carrier liquid that can include one or more solvents. A substrate may subsequently undergo processing involving thermal treatment, such as drying, baking or a combination thereof. Such thermal treatment steps may be done to drive off a carrier liquid, as well as to induce a physical or chemical change in the material in order to form a film having various desired properties. Given the critical nature of drying and baking steps on film formation, various embodiments of thermal treatment modules of the present teachings for carrying out drying and baking can be used as a process development tool, and additionally for production.

In that regard, various drying and baking modules of the present teachings are capable of supporting process development, as various embodiments of drying and baking modules of the present teachings have the flexibility to test a variety of parameters related to any process step. Then in production, a drying and baking module of the present teachings can use a single process determined during process development for a drying or baking step. By way of an example, a tool providing for both condensation plate cooling and substrate heating may provide the flexibility for process development, whereas for a production tool, it may be desirable to utilize either condensation plate cooling or substrate heating. In another example, the selection of process environment for a process development module may include greater flexibility for testing various process environments than for a production tool. For example, with respect to process environment, a process development module may have the capability to have an inert gas environment for some process steps, and other gas environments for other process steps. Then, for a production tool, the process gas environment would be an environment as determined by process development for that process step.

Accordingly, there is a need in the art for manufacturing tools for drying and baking of a substrate that can be easily adaptable between the flexibility needed for process development, as well as the specific needs of any process step in a manufacturing tool.

BRIEF DESCRIPTION OF THE DRAWINGS

FIG. 1D is an enlarged view of the region of the drying module indicated in FIG. 1C.

Figure 1A:
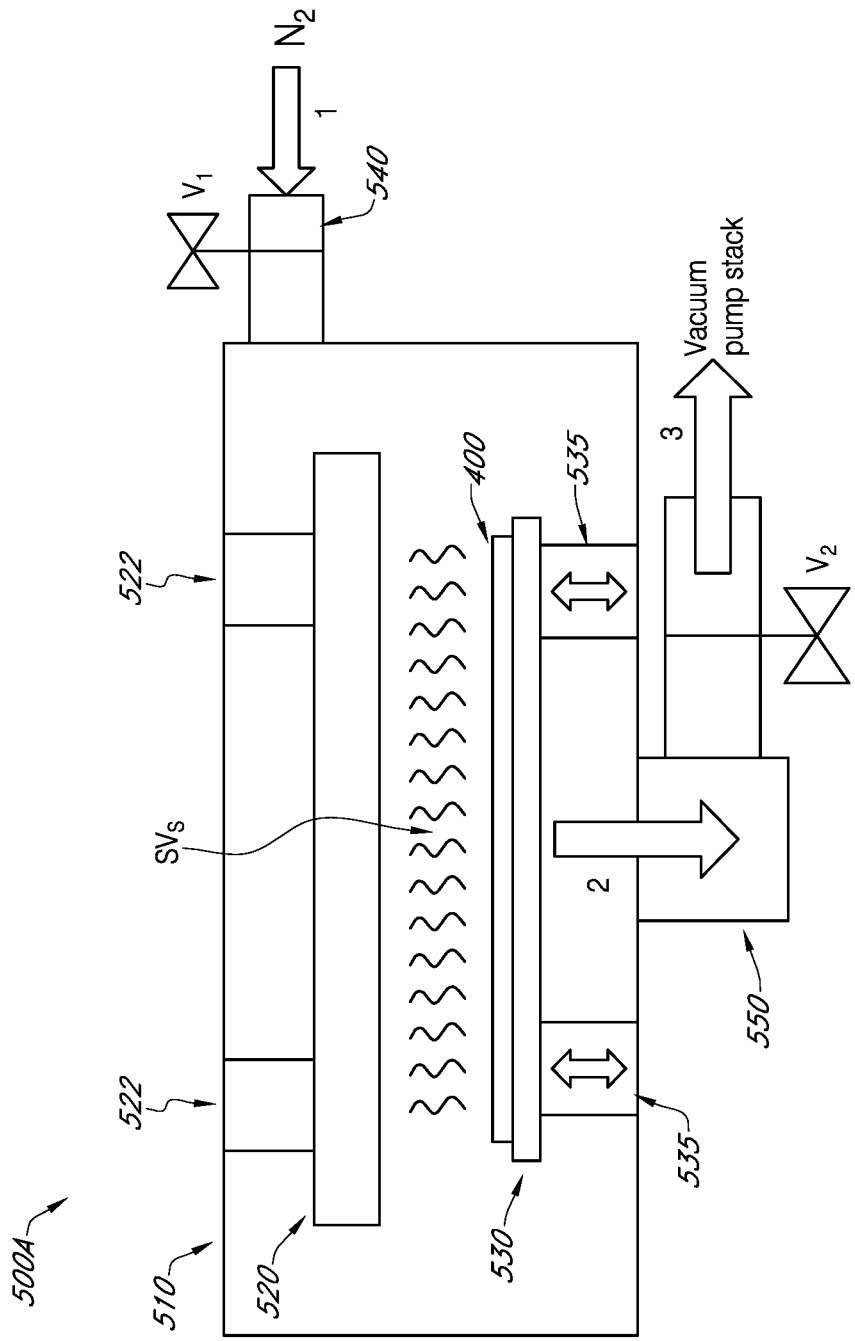
FIG. 1A and FIG. 1B are schematic renderings that illustrate generally various embodiments of a drying module of the present teachings utilizing a condensation plate.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

What is disclosed herein are embodiments of thermal treatment modules for performing drying and baking as part of processing a substrate, for example, a substrate used in the fabrication of various OLED devices. According to the present teachings, after the deposition of a liquid ink on a substrate, the substrate may subsequently require drying, baking or a combination thereof. Such thermal treatment steps may be done to drive off a carrier liquid, as well as to induce a physical or chemical change in the material in order to form a film having various desired properties. Various embodiments of thermal treatment modules of the present teachings can be utilized for process development as well as for production use.

Thermal treatment of a substrate onto which a liquid material has been deposited is an important step when depositing films by printing and other liquid coating methods. As previously discussed herein, thermal treatment of a substrate can include drying, baking or a combination thereof. In various embodiments of a liquid deposition process, a liquid can be printed onto a substrate in a pattern and the liquid can be exposed to a drying process so as to remove or substantially remove one or more volatile components of the liquid and in so doing form a film. For example, a film material can be dissolved in a carrier fluid to collectively form an ink, an ink can be printed into a pattern on a substrate, and in a subsequent drying process the carrier fluid can be evaporated to form a film material. Alternatively, for example, an ink can include a film material suspended in a carrier fluid. According to the present teachings, various drying processes can provide for uniform drying of a substrate across the entirety of, or at least over certain subsections of, a substrate.

For various thermal treatment modules of the present teachings, an exemplary substrate may be a portion of an OLED flat panel display and an ink may be an ink for one of stack layer of an OLED pixel. For various inks formulations that can be prepared for printing various OLED stack layers, a material can be dissolved or suspended in a carrier fluid and a printing process may deposit the ink into one or more discrete pixel regions. After thermal treatment of the substrate to remove or substantially remove the carrier fluid, the resulting films may comprise active OLED layers in discrete OLED pixels. In such an example, the thickness uniformity of the deposited OLED layer film, both with respect to the uniformity within an individual discrete pixel region as well as with respect to different discrete pixel regions across a substrate, may impact the visual quality of the resultant OLED display product.

In that regard, for example, a drying process may impact the thickness uniformity of the deposited film within a particular discrete pixel region, for example, as a result of the drying process being faster or slower than a target drying rate. Accordingly, it can be desirable to control the drying process over a substrate area so as to achieve highly uniform drying. In one example, the uniformity of drying can be controlled with respect to an average rate of drying over the duration of the drying process. In another example, the uniformity of drying can be controlled with respect to the drying rate as a function of time during the entire drying process or at least a during portion of the drying process.

When drying a substrate coated with a liquid, it can be challenging to achieve a uniform drying rate. While not being bound by theory, one explanation of the challenge at least in part can come from a difference in the accumulation of liquid vapor above the substrate in the center as compared to the edge. For example, in a case of drying a substrate coated with a large array of many identical discrete regions of liquid, where these discrete regions can be thought of as individual "droplets" of liquid or as individual "wells" of liquid, as the volatile part of the liquid evaporates, a vapor of this volatile material can build up above the substrate. This vapor can then begin to diffuse out from the center to the edge, as outside of the substrate area there is no vapor, and diffusion is known to drive a flow of material from higher concentrations to lower concentrations of material. Overtime, this can establish a concentration gradient of a higher concentration of vapor in the center of the substrate and a lower concentration of vapor at the edge of the substrate. Since a higher concentration of a vapor immediately above a liquid suppresses further evaporation of the volatile component as compared to a lower concentration of a vapor, can lead to a condition in which the rate of evaporation at the edge of a substrate is higher than the rate of evaporation at the center of a substrate. As given by this example, it can be generally indicated that any variation in the concentration of vapor above a substrate can lead to variation in the rate of evaporation. Further, in some processes, the thickness profile of a film formed by drying a liquid is dependent on the rate of drying. For example, a droplet on a substrate may dry quickly and form a "coffee ring" (i.e. a thin region in the center with a thick ring at the edge) or may dry slowly and form a "hill" (i.e. a thick region in the center tapering down in thickness from center to edge), or may dry at a rate in between and form a yet different profile.

In an exemplary printing process of one or more OLED displays on a substrate, an ink for forming a film of an OLED stack can be printed into discrete OLED pixels. For such a printing process, depending on the drying rate, the resulting film formed after drying the OLED layer ink can be uniform and flat, can be non-uniform and mounded in the center (e.g. a "hill"), or can be non-uniform and piled up at the edges (e.g. a "coffee ring"). Additionally, if the rate of drying is non-uniform across the substrate, then the layers in some pixels will have the uniform profile, while layers in other pixels may have the non-uniform profile with a mound in the center, and still other pixels may have the non-uniform with pile up at the edges. This condition would lead to variability is performance of the pixels in an end-product display, which may not be desirable.

With respect to processing a substrate after the deposition of various coatings on a substrate, various thermal treatment modules of the present teachings can provide for systems, apparatuses and methods for drying and baking substrates uniformly over an entire substrate area, or over particular subsets of a substrate area. Various thermal treatment modules of the present teachings can provide for systems, apparatuses and methods for drying and baking substrates uniformly in both a process development environment, as well as a production environment. Furthermore, for example, as the specific drying conditions required to produce a particular film profile may require a wide range of different drying conditions, various thermal treatment modules of the present teachings provide substantial flexibility in controlling the kinds of parameters that are important for drying; such parameters that can include the temperature at which the drying occurs, the pressure at which the drying occurs, and the rate which vapors are removed from above the substrate region.

For example, FIG. 1A is a depiction of various embodiments of drying module 500A that can utilize a condensation plate. Various embodiments of drying module 500A as depicted in FIG. 1A can include temperature-controlled condensation plate 520 mounted within drying chamber 510 on condensation support structure 522, so as to be positioned above substrate support apparatus 530, which can be a substrate tray or a chuck. Substrate support apparatus 530 can be mounted on substrate support apparatus base 535, which can provide for height adjustment of substrate support apparatus 530 relative to condensation plate 520. Upon substrate support apparatus 530, substrate 400 can be mounted as depicted in FIG. 1A. Drying chamber 510 can have gas refill port 540, which can have a gas in flow communication with drying chamber 510 controlled using valve $V_1$. In various embodiments of drying module 500A, valve $V_1$ can be a needle valve. According to the present teachings, a gas supplied via gas refill port 540 can include, for example, but not limited by, nitrogen clean dry air and argon. Additionally, a gas supplied via gas refill port 540 can be controlled to maintain a specified maximum amount of oxygen, moisture, ozone content, or a combination thereof. Drying chamber 510 can be in flow communication with a vacuum pump stack through exhaust port 550. The flow of gas from chamber 510 through exhaust port 550 can be controlled using valve $V_2$. In various embodiments of drying module 500A, valve $V_2$ can be a throttle valve.

For various embodiments of drying module 500A of FIG. 1A, the temperature of temperature-controlled condensation plate 520 can be adjusted so as to establish a temperature difference with respect to substrate 400. Additionally, substrate support apparatus 530 can be adjusted so as to establish a controllable distance gap G between condensation plate 520 and substrate 400. According to the present teachings, for various embodiments of drying module 500A, during a drying process, gap distance G between condensation plate 520 and substrate 400 can be between about 1 mm to about 20 mm. For various embodiments of drying module 500A, during a drying process, gap distance G between condensation plate 520 and substrate 400 can be between about 2 mm to about 10 mm. In various embodiments of drying module 500A, substrate support apparatus 530 can be temperature controlled. In various embodiments, temperature-controlled condensation plate 520 can be heated, cooled, or both. In various embodiments of drying module 500A, the temperature-controlled substrate support can be heated, cooled, or both. For various embodiments of drying module 500A, solvent can be removed from substrate 400 onto condensation plate 520 primarily via a diffusion process driven by a temperature difference established by having substrate 400 at a temperature that is higher than the temperature of condensation plate 520. According to the present teachings, a temperature difference between substrate 400 and condensation plate 520 can be established via heating of a substrate, cooling of a condensation plate, or both. For various embodiments of drying module 500A, heating of substrate 400 can be accomplished by heating substrate support apparatus 530. In various embodiments of drying module 500A, heating of substrate 400 can be accomplished by directing heated gas onto the back-side of substrate support apparatus 530. In various embodiments of drying module 500A, heating of substrate 400 can be accomplished by a remote heating mechanism, for example, infra-red (IR) heating via an IR lamp (not shown).

According to the present teachings, solvent vapors $SV_S$ can diffuse from substrate 400 to condensation plate 520, where they condense, due to a temperature difference between substrate 400 and condensation plate 520. For various embodiments of drying module 500A, an ambient vacuum can be established, and then solvent vapors $SV_S$ can form due to evaporation of solvent from substrate 400 and then diffuse to condensation plate 520. Thereafter the condensed solvent is evaporated from condensation plate 520 by establishing an ambient vacuum in the chamber. For various embodiments of drying module 500A, evaporating solvent condensed on condensation plate 520 can include raising the temperature of condensation plate 520, establishing an ambient vacuum in the chamber, or both. Accordingly, the solvent evaporated from condensation plate 520 can be removed from a drying chamber via exhaust port 550, which is shown in FIG. 1A to be in flow communication to a vacuum pump stack. Exhaust port 550 can be in controllable flow communication with a vacuum pump stack using value $V_2$.

According to the present teachings, various embodiments of drying module 500A of FIG. 1A can be configured to heat a substrate from an ambient temperature to a temperature in a range of temperatures between about 40° C. to about 300° C. Various embodiments of drying module 500A can be configured to cool a substrate from an ambient temperature to a temperature in a range of temperatures between about −10° C. to about 15° C. For various embodiments of drying module 500A, a condensation plate can be configured with a cooling system to cool the condensation plate from an ambient temperature to a temperature in a range of temperatures between about −10° C. to about 15° C. In various embodiments of drying module 500B, a condensation plate can be configured with a heating system to heat the condensation plate from an ambient temperature to a temperature in a range of temperatures between about 40° C. to about 300° C. For various embodiments of drying module 500A, to remove solvent that condensed on a condensation plate as a result of a drying process, a condensation plate can be heated from an ambient temperature to a temperature in a range of temperatures between about 60° C. to about 200° C. According to the present teachings, an ambient temperature can be between about 15° C. to about 85° C.

Various embodiments of drying module 500A as depicted in FIG. 1A can be configured so that a vacuum pump stack can bring drying chamber 510 down to high vacuum, which can facilitate the efficient evaporation even for solvents having relatively high boiling points, for example, boiling points of 180° C. or higher. Additionally, various embodiments of drying module 500A as depicted in FIG. 1A can utilize a vacuum pressure program for establishing a controlled ambient pressure as a function of time. A vacuum pressure program for drying module 500A can control valve $V_1$ on gas refill port 540 and valve $V_2$ on exhaust port 550 by using a feedback pressure control loop (not shown). As previously discussed herein, valve $V_1$ can be a needle valve and valve $V_2$ can be a throttle valve.

Table 1 summarizes operating parameters and related values that various embodiments of drying module 500A of FIG. 1A may provide during the processing of a substrate.

According to operating parameters summarized in Table 1, for various embodiments of drying module 500A, an ink on a substrate can be dried via exposure to ambient vacuum, in which a liquid content of an ink evaporates and is pumped out of the module, or via exposure in close proximity to a relatively cooler condensation plate, in which a liquid content of an ink evaporates and diffuses to the condensation plate where it condenses, or via a combination of the two. As indicated in Table 1, various embodiments of drying module 500A can be configured to achieve a base pressure of $1 \times 10-6$ Torr or less via a high vacuum pumping stack pumping an empty chamber for an extended period of time. For various embodiments of drying module 500A can be configured to approach a maximum process vacuum of $1 \times 10-5$ Torr following drying of a substrate via a high vacuum pumping stack pumping on a drying chamber for a relatively short period of time, for example after a substrate is substantially dry, for a time that can be selected in a range, for example, of about 5 s to about 960 s and for various embodiments, for example, a time that can be selected in a range of about 15 s to about 480 s. Various embodiments of drying module 500A can be configured with a pressure control system for actively controlling the pressure to a certain set point pressure as a function of time (specified as a series of steps in a pressure program, each step specifying the pressure as a function of time over a certain period of time) over a set point range from ambient pressure down to 10 mTorr, and a pressure control system can establish an ambient pressure with an accuracy of ≤5±% of the set point. Various embodiments of drying module 500A, as indicated in Table 1 can be configured to control of the temperature of a condensation plate over a range from −20° C. to ambient temperature with an accuracy of ≤±2° C. as measured with respect to the mean temperature over the condensation plate area and with a uniformity of ≤±2° C. around the mean temperature over the condensation plate area. As indicated in Table 1, various embodiments of drying module 500A can be configured to control the temperature of a substrate over a range from ambient to 100° C. with an accuracy of ≤±2° C. (as measured with respect to the mean temperature over the substrate area) and with a uniformity of ≤±2° C. around the mean temperature over the substrate area. Various embodiments of drying module 500A can be configured to control a gap between a substrate and condensation plate over a range from about 0 mm to 20 mm, as indicated in Table 1.

TABLE 1

Operating parameters related to embodiments of drying module 500A

| Substrate Drying Mechanisms | Ambient Vacuum and Condensation Plate |
|---|---|
| Chamber Base Pressure | ≤1 × 10−6 Torr |
| Max Process Vacuum | ≤1 × 10−5 Torr |

TABLE 1-continued

Operating parameters related to embodiments of drying module 500A

| | |
|---|---|
| Pressure range supporting pressure control | Ambient to 10 mTorr |
| Pressure control accuracy (within pressure control range) | ≤5± % of set point |
| Vacuum Control Programming | Multi-Step Pressure Profile Program |
| Condensation Plate Temp Control | Range: −20° C. to Ambient<br>Accuracy (of mean): ±2° C.<br>Uniformity: ≤±2° C. around mean |
| Condensation Plate and Substrate Gap Control | Gap Range: 1 mm to 20 mm |
| Substrate Temp Control | Range: Ambient to 100° C.<br>Accuracy (of mean): ±2° C.<br>Uniformity: ≤±2° C. around mean |

With respect to all of the drying and baking modules disclosed herein, having operating parameters summarized herein in Table 1 through Table 5, the substrate temperature control and temperature uniformity of a substrate area can equivalently refers to only the subset of the substrate area over which the thermal treatment must be controlled within a target range to achieve a desired process result, for example, within the active area of a flat panel display device being manufactured on a substrate or over the entire substrate area but excluding a perimeter region called an "edge exclusion zone." In various embodiments, such an "edge exclusion zone" can be defined such that the substrate area over which the temperature must be controlled within a target range to achieve a desired process result includes the entirety of the substrate except for an edge exclusion zone on all sides. An edge exclusion zone can vary for various substrates, for example, an edge exclusion zone can be a width of ≤5 mm for various substrates, or a width of ≤10 mm for various substrates, while for various substrates, the width of an edge exclusion zone can be ≤20 mm, or for various substrates, an edge exclusion zone can be ≤50 mm.

Figure 1B:
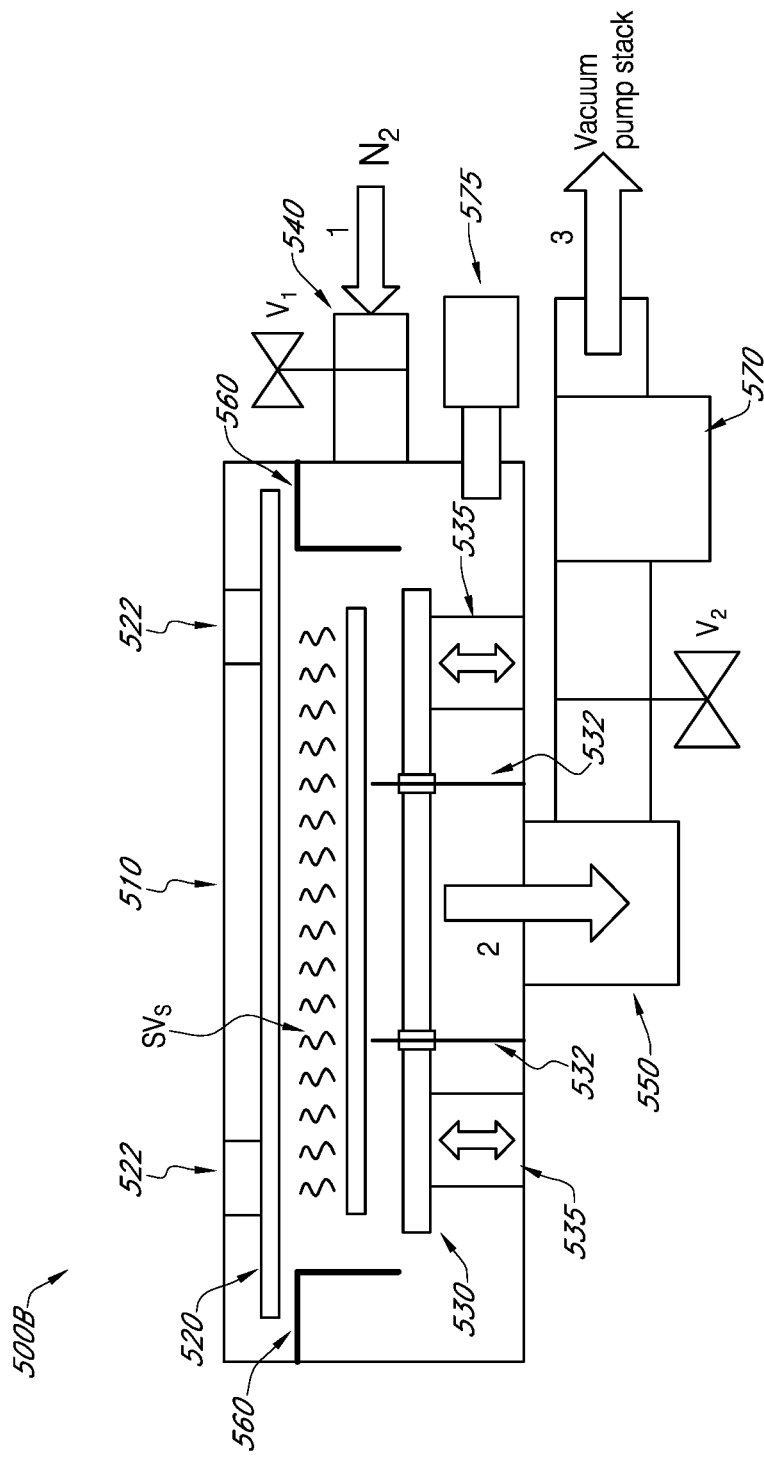

Various embodiments of drying module 500B as depicted in FIG. 1B can include temperature-controlled condensation plate 520 mounted within drying chamber 510 on condensation support 522, so as to be positioned above temperature-controlled substrate support apparatus 530, which can be a chuck or a tray. Substrate support apparatus 530, which can be a substrate tray or a chuck, can be mounted on substrate support apparatus base 535, which can provide for height adjustment of substrate support apparatus 530 relative to condensation plate 520. Upon substrate support apparatus 530, substrate 400 can be mounted as depicted in FIG. 1B. As previously described for drying module 500a of FIG. 1A, drying chamber 510 can have gas refill port 540, which can have a gas in flow communication with drying chamber 510 controlled using valve $V_1$. In various embodiments of drying module 500B, valve $V_1$ can be a needle valve. According to the present teachings, a gas supplied via gas refill port 540 can include, for example, nitrogen clean dry air and argon. Additionally, a gas supplied via gas refill port 540 can be controlled to maintain a specified maximum amount of oxygen, moisture, ozone content, or a combination thereof.

Drying chamber 510 of FIG. 1B can be in flow communication with a vacuum pump stack through exhaust port 550. The flow of gas from chamber 510 through exhaust port 550 can be controlled using valve $V_2$. In various embodiments of drying module 500B, valve $V_2$ can be a throttle valve. In various embodiments of drying module 500A of FIG. 1A and 500B of FIG. 1B, a vacuum pump stack used to pump gas out of the drying module chamber can be a roughing pump, a roughing pump and a turbo pump, or a roughing pump and a cryogenic pump. In various embodiments of a drying module, a roughing pump can be a dry pump, for example, a scroll pump, a diaphragm pump, a screw pump, or another kind of pump without pump oil exposed to the pumping pathway, so as to minimize contamination of the drying chamber with pump oil.

For various embodiments of drying module 500B of FIG. 1B, temperature-controlled substrate support apparatus 530 can have lift pins 532 included as part of the apparatus. Lifts pins 532 can be configured to hold substrate 400 at a particular fixed height, or to lift substrate 400 to a particular height, for example, that can enable a handler to readily manipulate a substrate during loading and unloading of substrate 400 into and out of drying module 500B. A substrate chuck and lift pin combination may be configured so that substrate 400 can be placed on lift pins 532 and through motion of substrate support apparatus 530, lift pins 532, or both, substrate 400 can rest upon and be held by substrate support apparatus 530. Various embodiments of drying module 500B utilizing a temperature-controlled substrate support apparatus 530, for example, as a heated chuck, can include edge shields 560. According to the present teaching, any of the various embodiments of a drying module can include edge shields to provide a vapor hood that can prevent or greatly minimize vapor diffusion out of the region above the substrate that can occur at the edge of a substrate, as well as to prevent or reduce inflow of gas at the edge of the condensation plate that may disturb the flow or distribution of vapor above the substrate. As previously discussed herein, vapor emanating from a substrate can be the result of evaporation of a carrier liquid used in the preparation of a film-forming ink, in which the carrier liquid can be a solvent or a combination of solvents.

Additional features of various embodiments of drying module 500B of FIG. 1B can include vapor abatement system 570, which can be located in line between drying module 500B and a vacuum pump stack, as well as vapor monitor 575, for monitoring the levels of various vapors in drying module 500B. Various embodiments of vapor abatement system 570 can remove vapors from the gas flowing through vapor abatement system 570, which can be configured with, for example, a mechanical filter, a chemical filter, or a cold trap.

Various embodiments of drying module 500B of FIG. 18 can have temperature-controlled condensation plate 520 above temperature-controlled substrate support apparatus 530, as well as a controllable distance gap G between condensation plate 520 and substrate 530. According to the present teachings, for various embodiments of drying module 500A, during a drying process, gap distance G between condensation plate 520 and substrate 400 can be between about 1 mm to about 20 mm. As previously described herein for various embodiments of drying module 500A of FIG. 1A, for embodiments of drying module 500B of FIG. 18, solvent can be removed from substrate 400 primarily via a temperature driven diffusion onto condensation plate 520, in which the solvent vapors $SV_S$ are driven from substrate 400 via heating of substrate 400, cooling of condensation plate 520, or both. For various embodiments of drying module 500B, an ambient vacuum can be established, and then solvent vapors $SV_S$ can form due to evaporation of solvent from substrate 400 and then diffuse to condensation plate 520. According to the present teachings, temperature driven diffusion of vapors from substrate 400 onto condensation plate 520 can occur through some combination of temperature control that establishes a temperature difference in which substrate 400 is relatively hotter than condensation plate 520. After vapors condense on condensation plate 520, they can then be evaporated from condensation plate 520 via ambient vacuum.

According to the present teachings, various embodiments of drying module 500B of FIG. 1B can be configured to heat a substrate from an ambient temperature to a temperature in a range of temperatures between about 40° C. to about 300° C. Various embodiments of a drying module 500B can be configured to cool a substrate from an ambient temperature to a temperature in a range of temperatures between about −10° C. to about 15° C. For various embodiments of drying module 500B, a condensation plate can be configured with a cooling system to cool the condensation plate from an ambient temperature to a temperature in a range of temperatures between about −10° C. to about 15° C. In various embodiments of drying module 500B, a condensation plate can be configured with a heating system to heat the condensation plate from an ambient temperature to a temperature in a range of between about 40° C. to about 300° C. For various embodiments of drying module 500B, to remove solvent that condensed on a condensation plate as a result of a drying process, a condensation plate can be heated from an ambient temperature to a temperature in a range of temperatures between about 60° C. to about 200° C. According to the present teachings, an ambient temperature can be between about 15° C. to about 85° C.

As previously described herein for drying module 500A of FIG. 1A, various embodiments of drying module 500B of FIG. 1B can be configured so that a vacuum pump stack can bring drying chamber 510 down to high vacuum, which can facilitate the efficient evaporation even for solvents having relatively high boiling points, for example, boiling points of 180° C. or higher. Various embodiments of drying module 500B as depicted in FIG. 1B can utilize a vacuum pressure program for establishing a controlled ambient pressure as a function of time. Such a vacuum pressure program can be configured to control valve $V_1$ on gas refill port 540 and valve $V_2$ on exhaust port 550 by using a feedback pressure control loop (not shown). As previously discussed herein, valve $V_1$ can be a needle valve and valve $V_2$ can be a throttle valve.

Table 2 summarizes operating parameters and related values that various embodiments of drying module 500B may provide during the processing of a substrate.

According to operating parameters summarized in Table 2, for various embodiments of drying module 500B, an ink on a substrate can be dried via exposure to ambient vacuum, in which a liquid content of an ink evaporates and is pumped out of the module, or via exposure in close proximity to a relatively cooler condensation plate, in which a liquid content of an ink evaporates and diffuses to the condensation plate where it condenses, or via a combination of the two. As indicated in Table 2, various embodiments of drying module 500B can be configured to achieve a base pressure of 1×10-6 Torr or less via a high vacuum pumping stack pumping an empty chamber for an extended period of time. For various embodiments of drying module 500B can be configured to approach a max process vacuum of 1×10-5 Torr following drying of a substrate via a high vacuum pumping stack pumping on a drying chamber for a relatively short period of time, for example after a substrate is substantially dry, for a time that can be selected in a range, for example, of about 5 s to about 960 s and for various embodiments, for example, a time that can be selected in a range of about 15 s to about 480 s. Various embodiments of drying module 500B can be configured with a pressure control system for actively controlling the pressure to a certain set point pressure as a function of time (specified as a series of steps in a pressure program, each step specifying the pressure as a function of time over a certain period of time) over a set point range from ambient pressure down to 100 mTorr, and a pressure control system can establish an ambient pressure with an accuracy of ≤5±% of the set point. A drying module 500B can be configured to control the temperature of a condensation plate over a range from 10 C to 45 C. Various embodiments of drying module 500B can be configured to control the temperature of a substrate over a range from ambient to 60 C. A drying module 500B can be configured to control the uniformity of the temperature difference between a condensation plate and a substrate to be ≤±5° C. (as measured with respect to the mean temperature difference over the substrate area). Various embodiments of drying module 500B, as indicated in Table 2, can be configured to control the uniformity of the temperature difference between a condensation plate and a substrate to be ≤±15% of the mean temperature difference (as measured with respect to the mean temperature difference over the substrate area). As indicated in Table 2, various embodiments of drying module 500B can be configured to control a gap between a substrate and condensation plate over a range from 1 mm to 20 mm. Various embodiments of drying module 500B, as indicated in Table 2, can be configured to control the uniformity of a gap between a substrate and condensation plate to be ≤±500 um (as measured with respect to the mean gap over the substrate area). Various embodiments of drying module 500B can be configured to control the uniformity of a gap between a substrate and condensation plate to be ≤±10% of the mean gap over the substrate area (as measured with respect to the mean gap over the substrate area), as indicated in Table 2.

TABLE 2

Operating parameters related to embodiments of drying module 500B

| | |
|---|---|
| Substrate Drying Mechanisms | Ambient Vacuum and Condensation Plate |
| Chamber Base Pressure | 1 × 10−6 Torr |
| Max Process Vacuum | 1 × 10−5 Torr |
| Pressure range supporting pressure control | Ambient to 100 mTorr |
| Pressure control accuracy (within pressure control range) | +/−5% of set point |
| Vacuum Control Programming | Multi-Step Pressure Profile Program |
| Condensation Plate Temp Control | Range: −10° C. to 45° C. |
| Substrate Temp Control | Range: Ambient to 60° C. |
| Temperature Delta (Substrate/Condensation Plate) Uniformity (over substrate area) | ≤±5° C. around mean delta OR ≤±15% of mean delta around mean delta |
| Condensation Plate to Substrate Gap Control | Gap Control Range: 1 mm to 20 mm |
| Condensation Plate to Substrate Gap Uniformity (over substrate area) | ≤+/−500 um around mean gap OR ≤±10% of mean gap around mean gap |

Various embodiments of drying module 500A of FIG. 1A and drying module 500B of FIG. 1B of the present teachings provide the flexibility of modifying process parameters such as a temperature of a substrate and a temperature of a condensation plate (or temperature difference between them), by utilizing a vacuum pressure program, as well as providing flexibility over defining a gap G between substrate 400 and a condensation plate 520. Such flexibility over parameters impacting substrate drying can provide the flexibility for process development as well as for periodic machine tuning and recalibration in a production environment. Such parameters once determined during process development can be readily set for a manufacturing tool.

Figure 1C:
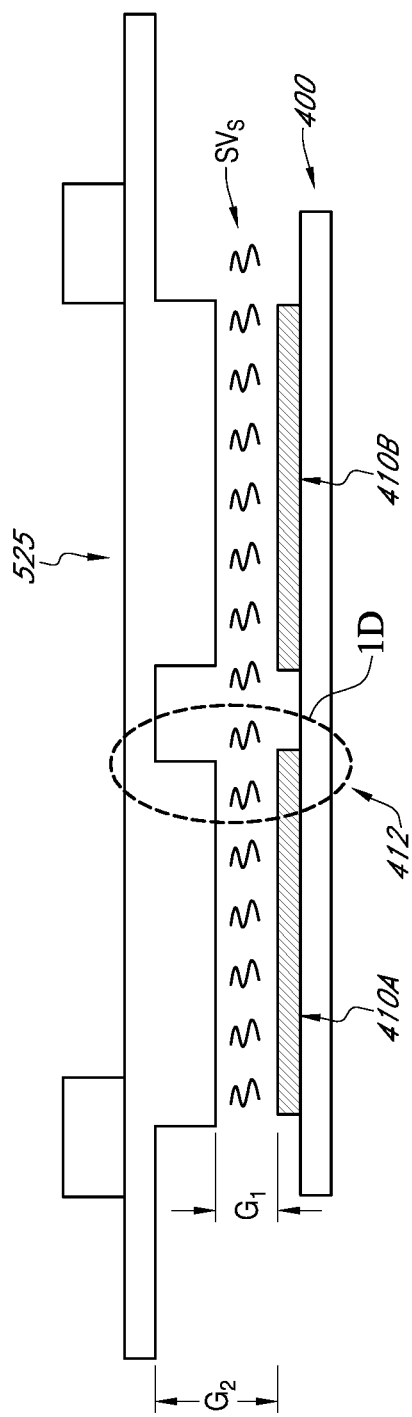
FIG. 1C is a modification of a drying module with a condensation plate that could be used with various embodiments of a drying module of the present teachings.

FIG. 1C and FIG. 1D depict condensation plate 525, for which various embodiments can be used with embodiments of a drying module of the present teachings, such as drying module 500A of FIG. 1A and drying module 500B of FIG. 1B. The present inventors have found that condensation plate 520 of FIG. 1C and FIG. 1D can provide for uniform drying of a substrate.

By way of an overview for FIG. 1C and FIG. 1D, and while not being bound by theory, as previously discussed herein, a challenge to achieving a uniform drying rate for a substrate uniformly coated with a liquid ink can be due, at least in part, from a difference in the accumulation of liquid vapor above the substrate in the center of a substrate as compared to the edge. As such, the rate of drying in the center may be suppressed relatively more than at the edge, leading to non-uniform rates of drying from center to edge. Various drying modules of the present teachings can be configured to reduce non-uniform drying at the edge of a substrate, for example, by utilizing baffles or shields mounted within a drying chamber proximal to the edge of a substrate, which can interrupt the diffusive flow of vapor away from the substrate, and thereby relatively reduce the impact of this phenomenon. In various embodiments, the use of such shields or baffles establishes a condition where the rate of diffusion of vapor from the substrate to the condensation plate can be much greater than the rate of diffusion from the center outward beyond the substrate, thereby providing for a drying process with reduced edge effects.

However, in certain cases the liquid ink coated onto a substrate may not be uniform over the substrate area, but rather may have a particular pattern with distinct areas or features defined by regions with a coating and regions without a coating. For example, an ink coating pattern on a substrate can be a rectangular coated region with an uncoated perimeter region or a region of individual red, green, and blue pixel cells in the active area of a substrate for an OLED display device. In an additional example, an ink coating pattern on a substrate can be an array of two or more rectangular coated regions or may be regions of individual red, green, and blue pixel cells in the active area of a substrate for an OLED display device. Various embodiments of a substrate can have an array of such active areas that can define a substrate or mother glass size. A substrate or mother glass may have a size corresponding to a different Generation ("G"), for example, G3.5 (e.g. ~720 mm by ~630 mm), half-cut G6 (e.g. ~1500 mm by ~925 mm), G6 (e.g. ~1850 mm by ~1500 mm), G8 or G8.5 (e.g. ~2500 mm by ~2200 mm), G10, or G10.5 (e.g. ~3000 mm by ~2800 mm), or G11 (e.g. ~3000 mm by ~3000 mm). For example, a G8 substrate can be configured with an array of six active areas for 55" diagonal display devices, where each active area is separated at the periphery from other active areas by blank regions on the substrate that can, for example, later facilitate cutting the substrate into six separate displays for subsequent fabrication into final product as functioning display devices.

For such substrates having regions of pixels in an active area on the substrate surrounded by blank regions on the substrate, the rate of drying a liquid ink filling any individual pixel can be dependent on the rate at which the vapor of evaporated ink flows away from that individual pixel. During a drying process for a substrate, for a pixel in the middle of a large active region of filled pixels with a condensation plate in close proximity above that pixel, it is reasonable to assume the vapor flow rate is predominantly to a condensation plate. This is due to the physical arrangement of pixels in a large middle region of an active area, as there are equal amounts of liquid on all sides of such pixels, providing that the ink vapor concentration can be locally uniform for such pixels. In contrast, for a pixel at the edge of a large region of filled pixels in an active area, while it is reasonable to assume there can be the same substantial vapor flow rate towards the condensation plate as in the center, there will also be a vapor flow rate outward from the coated region into the uncoated region defined, for example, by blank regions in between the active areas. As such, the overall rate of evaporation from a pixel at the edge of a large region of filled pixels may be higher than at the center of a large region of filled pixels, due to this additional outward vapor flow into the uncoated region defined, for example, by blank regions in between the active areas.

In practice, it is observed that for a given substrate-to-condensation plate gap distance, the impact of this edge-driven outward vapor flow becomes significant starting with pixels located at a distance roughly equal to the substrate-to-condensation plate gap distance as measured from the edge of the coated region. For example, for a gap distance of 5 mm, the edge-driven outward vapor flow can lead to significant increases in drying rate starting at a distance of 5 mm from the edge, and the increase in drying rate continues to increase for pixels closer and closer to the edge, until the maximum drying rate is observed for those pixels at the very edge of the coated region. The same principles apply equally to a coated region that is not pixelated, for example, a blanket coated region, with respect to the local drying rate in a particular area of that coated region. In various embodiments of a drying process the liquid coating can be provided over a region that is larger than the target region requiring the coating for the function of the device being manufactured. For example, a substrate can be configured with active areas having a peripheral region comprised of "dummy" pixels that are not active in producing images on the display but provide for loading of ink into a pixel region in an area surrounding the active pixels. In such a substrate configuration, the actual region over which the liquid coating is provided extends beyond the active region by a certain width, called the dummy pixel width The present inventors have recognized that a drying module utilizing a condensation plate 525 configured with varying gap sizes, as schematically depicted in FIG. 1C and FIG. 1D, can provide for an effective solution to the edge effect, thereby providing uniform drying of a substrate. The present inventors have further recognized that the use of such condensation plate 525 can be further enhanced by using a substrate with dummy pixels around the perimeter of an active area of an OLED device. In FIG. 1C, condensation plate 525 is depicted above substrate 400 from which solvent vapors $SV_S$ are diffusing towards condensation plate 525. Substrate 400 is shown with active area or coated region 410A and active area or coated region 410B, which are depicted as separated by blank region 412. Condensation plate 525 can be configured to provide first gap, $G_1$, which promotes effective evaporation over an active area of an OLED device, and second gap, $G_2$, which is larger than the first gap, $G_1$, in order to slow down the evaporation rate at the edge. A region depicted in FIG. 1C is shown in an enlarged view in FIG. 1D. In FIG. 1D, condensation plate 525 is depicted over substrate 400 with active region 410A. In active region 410A, a plurality of pixels; an exemplary pixel 420A in the active and exemplary pixel 420D in the dummy pixel region, are shown filled with ink droplets 10. In the regions at the edge of active area 410A, as depicted in FIG. 1D, first gap, $G_1$, is over active pixel region I, while second gap, $G_2$, is over dummy pixel region II. According to various embodiments of a drying module of the present teachings, first gap $G_1$ between substrate 400 and condensation plate 525 can be between about 1 millimeter to about 20 millimeters, while a second gap $G_2$ between substrate 400 and a condensation plate 525 can be greater than the first gap by at least 1 millimeter.

Various embodiments of condensation plate 525 can be configured with a transition region in the face of condensation plate 525 facing substrate 400 in the area establishing first gap $G_1$ and second gap $G_2$. In various embodiments of condensation plate 525, the transition region comprises a relatively sharp step, as depicted in FIG. 1C and FIG. 1D, while other embodiments of condensation plate 525 can be configured with an angled region, or continuous profile connecting the two regions smoothly. In various embodiments, a continuous profile of a transition region between the areas establishing gap $G_1$ and $G_2$ can be tuned to control the relative local vapor flow rate from the substrate to the condensation plate to compensation for edge drying effects. In various embodiments of condensation plate 525 and related methods, all of the pixels represented in FIG. 1D can be active pixels, such that both region I and region II are part of the active region, in combination a condensation plate 525 having a progressively larger gap over a transition region such that the resulting drying rates of pixels in region II are not substantially different from the drying rates of pixels in region II.

According to the present teachings of a drying module utilizing various embodiments of condensation plate 525 of FIG. 1C and FIG. 1D, that is configured for drying a substrate, such as substrate 400 with dummy pixel region II, wherein G1 and G2 are the same, where the condensation plate everywhere provides for approximately the same gap, a dummy pixel width can be equal to the gap between the condensation plate and substrate. In various embodiments of a substrate configured with a dummy pixel region, the dummy pixel width can be equal to twice, three times, or even four times the gap between the condensation plate and the substrate.

According to the present teachings of a drying module utilizing various embodiments of condensation plate 525 of FIG. 1C and FIG. 1D wherein G2>G1, where the condensation plate 525 can be configured so as to provide for a reduced drying rate at the end of a coated region that is configured for drying a substrate, such as substrate 400 with dummy pixel region II, the dummy pixel width can be equal to the gap G1 between the condensation plate and substrate, or less than the gap G1 between the condensation plate and the substrate. In various embodiments of a drying module utilizing condensation plate 525 configured for drying a substrate with dummy pixels, such as condensation plate 525 of FIG. 1C and FIG. 1D, the dummy pixel width can be between about 10 μm (microns) to about 32 mm (millimeters). For various embodiments of a drying module utilizing condensation plate for drying a substrate with dummy pixels, such as condensation plate 525 of FIG. 1C and FIG. 1D the dummy pixel width can be between about 100 μm (microns) to about 500 μm (microns). In various embodiments of a drying module utilizing condensation plate for drying a substrate with dummy pixels, such as condensation plate 525 of FIG. 1C and FIG. 1D the dummy pixel width can be between about 1 mm to about 32 mm.

For various embodiments of drying modules of the present teachings, it can be desirable to utilize a gap between the substrate and the condensation plate that is relatively larger than the target dummy pixel width, for example, to reduce the sensitivity of the drying process to variation in the gap over the area of the substrate arising from imperfections in the construction as well as the positioning of a substrate, substrate support apparatus, and condensation plate, or to reduce the drying rate while otherwise maintaining the same temperature difference between the substrate and the condensation plate. In such a case, it can be desirable to locally reduce the flow rate of ink vapor from the substrate to the condensation plate at the edge of a coated region relative to the center so as to compensate for the edge-driven outward flow in a manner that reduces the required dummy pixel width, or eliminates the need for dummy pixels entirely.

According to the present teachings, various embodiments of condensation plate 525 of FIG. 1C and FIG. 1D can be physically patterned so as to establish different gaps between different substrate regions of a substrate and a condensation plate. For such embodiments, the different gaps are established relative to a pattern of a liquid coating on the substrate. For various embodiments of processing a substrate having active areas including a dummy pixel region, a condensation plate of the present teachings can be configured to provide a first gap over a first region within which a liquid coating is provided except for at the periphery of the first region, and a second gap over the periphery of a first region, as well as over a second region surrounding the first region. For various embodiments of a substrate, the second region does not have a liquid coating. In various embodiments, a coating over a first region comprises a dummy region within which the drying of the coating need not be uniform. In various embodiments of a substrate having active areas including a dummy pixel region, a coating over a first region comprises a dummy region within which the resulting layer after drying does not participate in the active function of the device being fabricated. In various embodiments, this dummy region can comprise an extension of a uniform coating or a set of dummy pixels surrounding a region of active pixels. For various embodiments of a substrate having active areas including a dummy pixel region, the width of the periphery region over which the second gap provided by a condensation plate of the present teachings intrudes over the first region is less than the width of the dummy region. In various embodiments of a substrate having active areas including a dummy pixel region, the width of the periphery region over which the second gap provided by a condensation plate of the present teaching intrudes over the first region is the same as the width of the dummy region.

Various drying processes can utilize drying module 500A of FIG. 1A or drying module 500B of FIG. 1B, which can be configured with various embodiments of condensation plate 525 of FIG. 1C and FIG. 1D. According to the present teachings of various drying processes, a liquid ink can be deposited in a pattern onto a substrate, the substrate can be placed on a substrate support apparatus in a drying module, the drying module can be sealed, the pressure in the drying module pressure can be reduced and accordingly controlled as a function of time according to a target pressure profile or a target pressure. Various embodiments of a drying module of the present teachings can be adjusted so as to place the surface of a substrate having the deposited liquid pattern close to a condensation plate, the temperature of the condensation plate can be controlled to be lower than the temperature of the substrate, and in such condition, the liquid component of a liquid ink can evaporate from the surface of the substrate and condense onto a condensation plate, wherein the dominant flow of evaporated ink vapors in the drying module emanate from the substrate surface and onto the condensation plate. In various embodiments of drying processes, both a substrate temperature and condensation plate temperature can be controlled, where such control can include controlling the substrate temperature above ambient or below ambient, controlling the condensation plate temperature above ambient or below ambient, or some combination thereof.

For various embodiments of drying processes of the present teachings, after the substrate is dry or substantially dry, a gap between the substrate and the condensation plate of a drying module can be adjusted so that the gap can be relatively larger than it would be during the evaporation of a liquid from the substrate. Additionally, the drying module pressure can be adjusted to establish a lower pressure in the drying module relative to the pressure in the module while the liquid is evaporating from the substrate, and the liquid condensed on the condensation plate can evaporate from the condensation plate and can be evacuated from the drying module via an exhaust port. Further, according to various embodiments of drying processes of the present teachings, while the liquid is evaporating from the condensation plate, a condensation plate temperature can be increased relative to the condensation plate temperature used during the evaporation of a liquid from the substrate, so as to facilitate more rapid evaporation of the liquid condensed on the condensation plate. According to various embodiments of drying processes of the present teachings, after the substrate is dry or substantially dry, the drying module pressure can be increased by using a process gas having a specified purity, such as nitrogen, clean dry air, or argon having a certain specified maximum amount of oxygen, water vapor, or ozone. In various embodiments of drying processes of the present teachings, after the condensation plate is dry or substantially dry, a drying module pressure can be increased by refilling the module with a process gas having a specified purity, such as nitrogen, clean dry air, or argon having a certain specified maximum amount of oxygen, water vapor, or ozone. Finally, after refilling the drying module with a process gas, the drying module can be opened and the substrate can be removed. According to various embodiments of a drying module of the present species, contamination of, for example, oxygen, water vapor, and ozone at less than about 100 parts per million (ppm), can be maintained in drying process environment to less than about 10 ppm, less than about 1 ppm, less than about 100 parts per billion (ppb), less than about 10 ppb, or less than about 1 ppb.

Figure 2A:
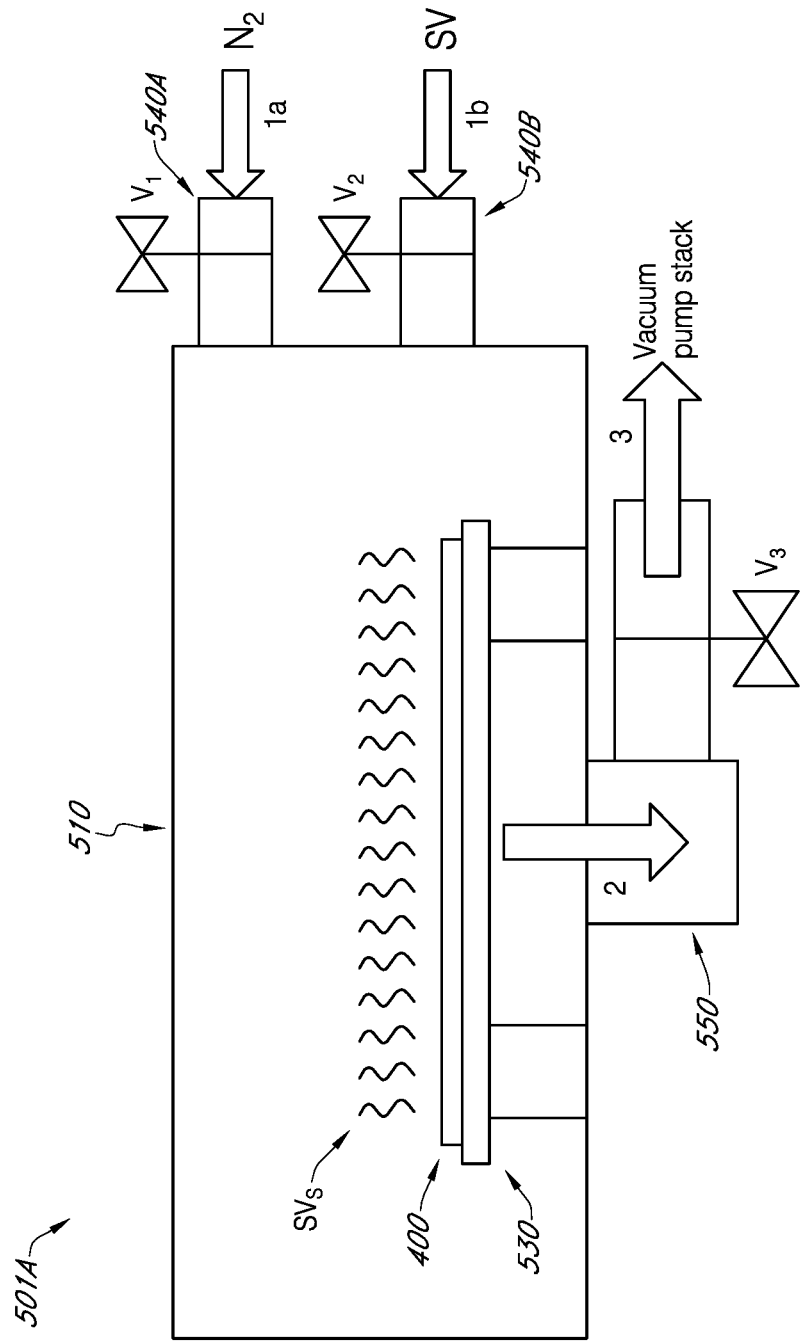
FIG. 2A and FIG. 2B are schematic renderings that illustrate generally various embodiments of a drying module of the present teachings utilizing a vacuum chamber.

FIG. 2A depicts various embodiments of drying module 501A of the present teachings utilizing a vacuum box or vacuum chamber. Various embodiments of drying module 501A configured with a vacuum box or vacuum chamber can have many of the attributes and features provided by embodiments of a drying module of FIG. 1A. For example, in various embodiments of drying module 501A, drying chamber 510 can house temperature-controlled substrate support apparatus 530, which can be a substrate tray or a chuck. Substrate support apparatus 530 can support substrate 400 during a drying process, as shown in FIG. 2A, depicting solvent vapors $SV_S$ emanating from substrate 400. A unique requirement for embodiments of a drying modules configured as a vacuum box or vacuum chamber is that materials in a carrier liquid used applied to a substrate during manufacture of must be formulated properly to achieve uniform drying using solely reduced pressure to remove the carrier liquid. Drying chamber 510 can have gas inlet port 540A, which can have a gas in flow communication with drying chamber 510 controlled using valve $V_1$. In various embodiments of drying module 501A, valve $V_1$ can be a needle valve. According to the present teachings, a gas supplied via gas inlet port 540A can include, for example, nitrogen clean dry air and argon. Additionally, a gas supplied via gas inlet port 540A can be controlled to maintain a specified maximum amount of oxygen, moisture, ozone content, or a combination thereof. Various embodiments of drying module 501A can be configured so that solvent vapors SV can be in flow communication with drying chamber 510 via solvent vapor inlet port 540B, which can be controlled using valve $V_2$. In various embodiments of drying module 501A, valve $V_2$ can be a needle valve. Drying chamber 510 can be in flow communication with a vacuum pump stack through exhaust port 550. The flow of gas from chamber 510 through exhaust port 550 can be controlled using valve $V_3$. In various embodiments of drying module 500A, valve $V_3$ can be a throttle valve. In various embodiments of the drying modules or baking modules disclosed herein, the solvent vapor SV introduced into a process chamber can be the same, or substantially the same, as the solvent vapor $SV_S$ produced by evaporation of a liquid coating on a substrate 400 and alternatively, solvent vapor SV introduced into a process chamber can be different from the solvent vapor $SV_S$ produced by evaporation of a liquid coating on a substrate 400.

Additionally, similar to embodiments of a drying module of FIG. 1A, various embodiments of drying module 501A of FIG. 2A can be configured so that a vacuum pump stack can bring drying chamber 510 down to high vacuum, which can facilitate the efficient evaporation even for solvents having relatively high boiling points, for example, boiling points of 180° C. or higher. Further, various embodiments of drying module 501A can utilize a vacuum pressure program configured to control a valve $V_3$ on gas outlet port 550 and valve $V_1$ on gas inlet port 540A by using a feedback pressure control loop (not shown). For various embodiments of a drying module 501A, valve $V_1$ can be a needle valve and valve $V_3$ can be a throttle valve. Various embodiments of drying module 501A of FIG. 2A can have a vacuum profile that can be programmed according to the requirements of a specific process. Various embodiments of drying module 501A can have a control system for controlling the flow of solvent vapors SV into drying chamber 510. Such a control system can have a control sensor (not shown) configured to measure the solvent vapor SV in drying chamber 510, and a feedback system (not shown) for controlling valves $V_2$ on solvent vapor inlet port 540B and valve $V_3$ on gas outlet port 550 so as to establish a certain solvent vapor SV level in the drying chamber 510. For various embodiments of a drying module 501A, valve $V_2$ can be a needle valve and valve $V_3$ can be a throttle valve.

Table 3 summarizes operating parameters and related values that various embodiments of drying module 501A may provide during the processing of a substrate.

As summarized in Table 3, for various embodiments of drying module 501A, an ink on a substrate can be dried via exposure to ambient vacuum, in which a liquid content of an ink evaporates and is pumped out of the module. Various embodiments of drying module 501A can be configured to achieve a base pressure of $1\times10^{-6}$ Torr or less via a high vacuum pumping stack pumping an empty chamber for an extended period of time. Various embodiments of drying module 501A can be configured to approach a max process vacuum of $1\times10^{-5}$ Torr following drying of a substrate via a high vacuum pumping stack pumping on a chamber for a relatively short period of time after a substrate is substantially dry, for example, for a time selected in a range of times of about 5 s to about 60 s; in various embodiments, for a time selected in a range of times of about 120 s to about 960 s. Various embodiments of drying module 501A as summarized in Table 3 can be configured with a pressure control system for actively controlling the pressure to a certain set point pressure as a function of time, specified as a series of steps in a pressure program, each step specifying the pressure as a function of time over a certain period of time. In that regard, various embodiments a pressure control system of drying module 501A can control a set point pressure from ambient pressure down to 1 mTorr, and a pressure control system can establish an ambient pressure with an accuracy of $\leq 5\pm\%$ of the set point. Various embodiments of drying module 501A can be configured to flow a solvent vapor SV into the drying chamber. The flow of solvent vapor SV can be controlled via a control system to establish a certain vapor pressure of solvent vapor SV in the chamber.

TABLE 3

Operating parameters related to embodiments of drying module 501A

| | |
|---|---|
| Substrate Drying Mechanisms | Ambient Vacuum |
| Chamber Base Pressure | $1\times10^{-6}$ Torr |
| Max Process Vacuum | $1\times10^{-5}$ Torr |
| Pressure range supporting pressure control | Ambient to 1 mTorr |
| Pressure control accuracy (within pressure control range) | +/−5% of set point |
| Vacuum Control Programming | Multi-Step Pressure/Hold program |
| Solvent Vapor Refill Option? | Yes |

Figure 2B:
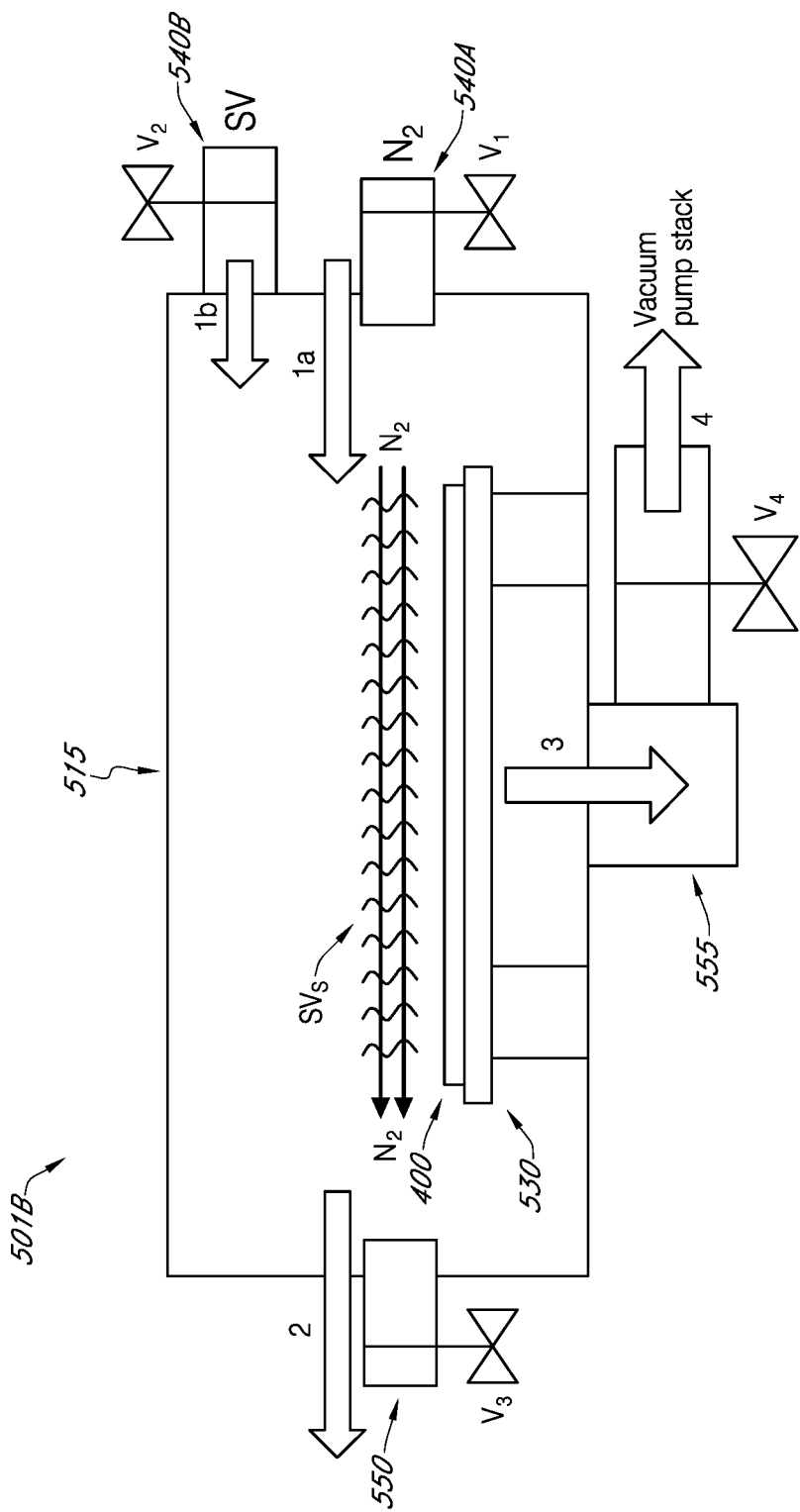

FIG. 2B is a depiction of various embodiments of baking module 501B of the present teaching utilizing a vacuum box of vacuum chamber. Various embodiments of baking module 501B configured with a vacuum box or vacuum chamber. In various embodiments of baking module 501B, baking chamber 515 can house temperature-controlled substrate heater 580 for supporting substrate 400 from which during a baking process, solvent vapors $SV_S$ can emanate. Various embodiments of temperature-controlled substrate heater 580 can be configured to heat substrate 400 from room temperature up to a maximum temperature of between about 250° C. to about 350° C. Baking chamber 515 can have gas inlet port 540A, which can have a gas in flow communication with baking chamber 515 controlled using valve $V_1$. In various embodiments of baking module 501B, valve $V_1$ can be a needle valve. According to the present teachings, a gas supplied via gas inlet port 540A can include, for example, nitrogen clean dry air and argon. Additionally, a gas supplied via gas inlet port 540A can be controlled to maintain a specified maximum amount of oxygen, moisture, ozone content, or a combination thereof. Various embodiments of baking module 501B can be configured so that solvent vapors $SV_S$ from a carrier liquid of an ink applied to substrate 400 can be in flow communication with baking chamber 515 via solvent vapor inlet port 540B, which can be controlled using valve $V_2$. In various embodiments of baking module 501B, valve $V_2$ can be a needle valve.

As depicted in FIG. 2B, various embodiments of baking module 501B can be configured to provide cross flow across the surface of substrate 400 during baking. Various embodiments of baking module can be configured with, for example, one or more inlet ports, such as gas inlet port 540A and solvent vapor inlet port 540B on one side of baking chamber 515 and one or more outlet ports, such as gas outlet port 550 that can be controlled by valve $V_3$, on the opposing side of baking chamber 515. For various embodiments of baking module 501B, the cross flow of gas can carry away solvent vapors $SV_S$ from the substrate surface. In various embodiments, the cross flow of gas can carry away outgassing species from the substrate surface, for example, trapped volatile contaminants that are released during baking. Baking chamber 515 can be in flow communication with a vacuum pump stack through exhaust port 555. The flow of gas from baking chamber 515 through exhaust port 555 can be controlled using valve $V_4$. In various embodiments of baking module 501B, valve $V_4$ can be a throttle valve.

Additionally, various embodiments of baking module 501B of FIG. 2B can be configured so that a vacuum pump stack can bring baking chamber 515 down to high vacuum, which can facilitate the efficient evaporation even for solvents having relatively high boiling points, for example, boiling points of 180° C. or higher. Further, various embodiments of baking module 501B can utilize a vacuum pressure program configured to control a valve $V_3$ on gas outlet port 550 and valve $V_1$ on gas inlet port 540A by using a feedback pressure control loop (not shown). For various embodiments of a baking module 501B, valve $V_1$ can be a needle valve and valve $V_3$ can be a throttle valve. Various embodiments of baking module 501B of FIG. 2B can have a vacuum profile that can be programmed according to the requirements of a specific process. Various embodiments of baking module 501B can have a control system for controlling the flow of solvent vapors SV into baking chamber 510. Such a control system can have a control sensor (not shown) configured to measure the solvent vapor SV in drying chamber 510, and a feedback system (not shown) for controlling valves $V_2$ on solvent vapor inlet port 540B and valve $V_3$ on gas outlet port 550 so as to establish a certain solvent vapor SV level in the drying chamber 510. Various embodiments of baking module 501B of FIG. 2B can have a vacuum profile that can be programmed according to the requirements of a specific process. For various embodiments of a baking module 501A, valve $V_2$ can be a needle valve and valve $V_3$ can be a throttle valve. In various embodiments of the drying modules or baking modules disclosed herein, the solvent vapor SV introduced into a process chamber can be the same, or substantially the same, as the solvent vapor $SV_S$ produced by evaporation of a liquid coating on a substrate 400 and alternatively, solvent vapor SV introduced into a process chamber can be different from the solvent vapor $SV_S$ produced by evaporation of a liquid coating on a substrate 400.

Table 4 summarizes operating parameters and related values that various embodiments of baking module 501B may provide during the processing of a substrate.

As summarized in Table 4, for various embodiments of drying module 501B, an ink on a substrate can be dried via exposure to ambient vacuum, in which a liquid content of an ink evaporates and is pumped out of the module. Various embodiments of baking module 501B can be configured to achieve a base pressure of $1\times10^{-6}$ Torr or less via a high vacuum pumping stack pumping an empty chamber for an extended period of time. Various embodiments of baking module 501B can be configured to approach a max process vacuum of $1\times10^{-5}$ Torr following drying of a substrate via a high vacuum pumping stack pumping on a chamber for a relatively short period of time after a substrate is substantially dry, for example, for a time selected in a range of about 5 s to about 60 s; in various embodiments, for a time selected in a range of about 120 s to about 960 s. Various embodiments of baking module 501B can be configured with a pressure control system for actively controlling the pressure to a certain set point pressure as a function of time, specified as a series of steps in a pressure program, each step specifying the pressure as a function of time over a certain period of time. For various embodiments of baking module 501B, a pressure can over a set point range from ambient pressure down to 1 mTorr, and a pressure control system can establish an ambient pressure with an accuracy of ≤5±% of the set point. Various embodiments of drying module 501A can be configured to flow a solvent vapor SV into the drying chamber. The flow of solvent vapor SV can be controlled via a control system to establish a certain vapor pressure of solvent vapor SV in the chamber. Various embodiments of baking module 501B can be configured to control the temperature of a substrate over a range from ambient to 350° C. with an accuracy of ≤±2° C. (as measured with respect to the mean temperature over the substrate area) and with a uniformity of ≤±2° C. around the mean temperature over the substrate area. Various embodiments of baking module 501B can be configured to provide a flow of gas across the surface of a substrate, utilizing one or more gas inlet ports on one side of a baking chamber and one or more gas outlet ports on another side of a baking chamber. Various embodiments of baking module 501B can be configured to provide a purified gas, for example, nitrogen, clean dry air, or argon, as the gas that is directed across the surface of the substrate.

TABLE 4

| Operating parameters related to embodiments of baking module 501B | |
| --- | --- |
| Substrate Drying Mechanisms | Ambient Vacuum |
| Chamber Base Pressure | $1 \times 10^{-6}$ Torr |
| Max Process Vacuum | $1 \times 10^{-5}$ Torr |
| Pressure range supporting pressure control | Ambient to 1 mTorr |
| Pressure control accuracy (within pressure control range) | +/−5% of set point |
| Vacuum Control Programming | Multi-Step Pressure/Hold program |
| Solvent Vapor Refill Option? | Yes |
| Substrate Temp Control | Range: Ambient to +350° C. Accuracy (of mean): ≤±2% Uniformity: ≤±2% around mean |
| Gas Flow (Across Substrate) Option? | Yes |

For various embodiments of drying module 501A of FIG. 2A and baking module 501B of FIG. 2B, a vapor inlet valve can be controlled to establish a programmable rate of flow as a function of time, or can be controlled to establish a certain vapor pressure within a process chamber, such as drying chamber 510 of drying module 501A or baking chamber 515 of baking module 501B. For various embodiments of thermal treatment modules of the present teachings, a vapor inlet port can supply a mixture of a saturated vapor of a particular material and a carrier gas, for example, air, nitrogen, clean dry air, and argon. In various embodiments of thermal treatment modules of the present teachings, such as drying module 501A and baking module 501B, a mixture of a saturated vapor and a carrier gas can be controlled to minimize contamination with certain materials, for example, oxygen, water vapor, and ozone, below a certain level. For example, a mixture of a saturated vapor and a carrier gas can be controlled to control the contamination of, for example, oxygen, water vapor, and ozone at less than about 100 parts per million (ppm), less than about 10 ppm, less than about 1 ppm, less than about 100 parts per billion (ppb), less than about 10 ppb, or less than about 1 ppb.

In various embodiments of thermal treatment processes of drying module 501A and baking module 501B, a substrate coated with a liquid ink can be loaded into a drying chamber, the drying chamber can then be sealed, a reduced pressure can be established within the drying chamber using a vacuum pump stack. During a period of time that a substrate is in a drying chamber under reduced pressure, a liquid in the ink can evaporate from the substrate and can be removed from the drying chamber via a pump port. In various embodiments of a drying process, while the substrate is drying under reduced pressure the substrate is heated. In various embodiments of a drying process, while the substrate is drying under reduced pressure, the substrate can be cooled. In various embodiments of a drying process, after drying the substrate under reduced pressure, for which at least between about 50% to about 99% of the liquid content of the ink has been evaporated, the substrate can be heated for a period of time. In various embodiments of thermal treatment processes of the present teachings, substantially all of the liquid content of the ink has been removed prior to removal of the substrate from a thermal treatment module. In various embodiments of thermal treatment processes of the present teachings, after drying the substrate under reduced pressure so that at least between about 50% to about 99% of the liquid content of the ink has been evaporated, a vapor can be introduced into the chamber via a vapor inlet port, during which time the vapor can interact with the substrate for a period of time, after which the vapor can be evacuated from a process chamber of a thermal treatment module. In various embodiments of thermal treatment processes of the present teachings, while the substrate is exposed to the vapor, the substrate can be heated. For various embodiments of thermal treatment processes of the present teachings, while the substrate is exposed to a vapor, the substrate can be cooled.

Figure 3A:
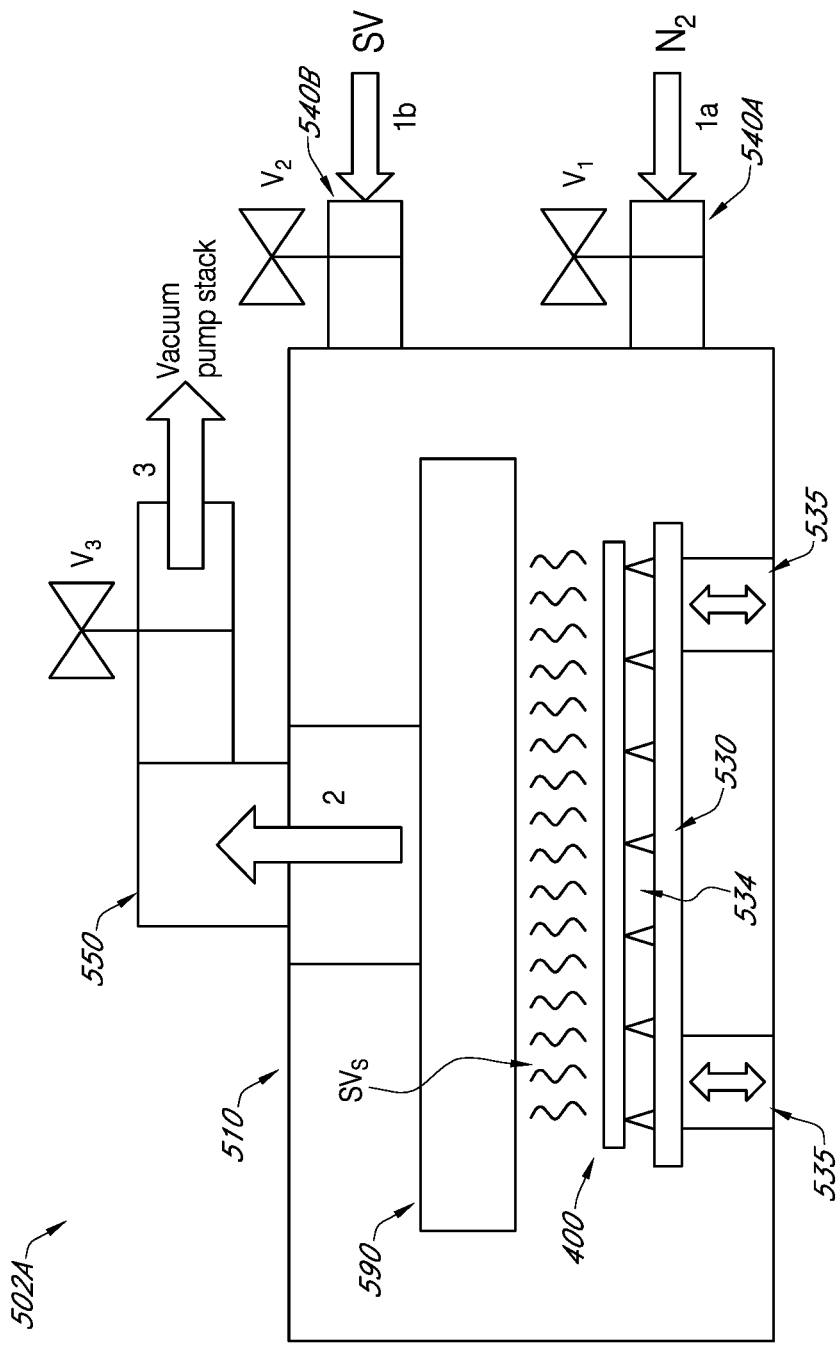
FIG. 3A through FIG. 3C are schematic renderings that illustrate generally various embodiments of a drying module of the present teachings utilizing a showerhead.
Figure 3B:
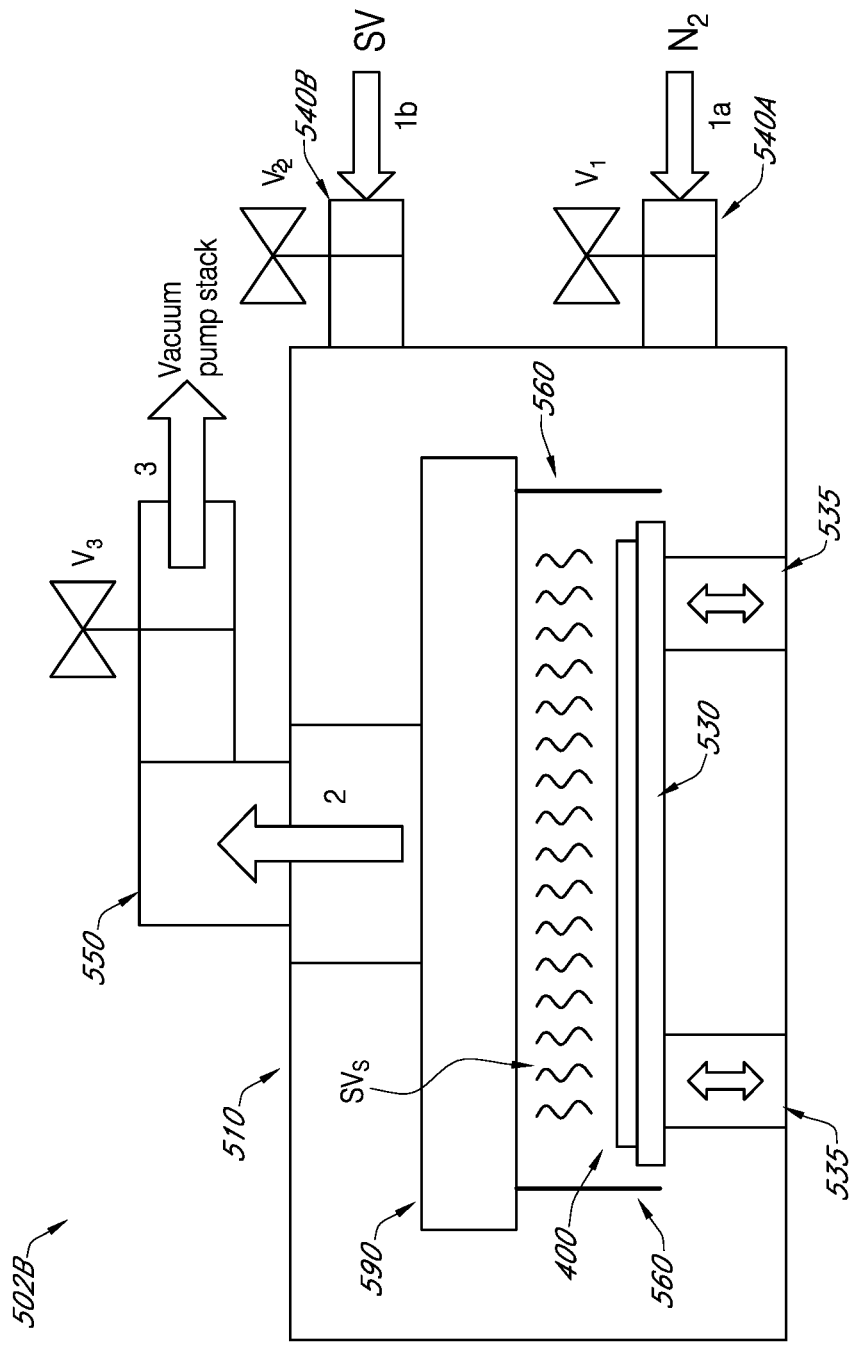
Figure 3C:
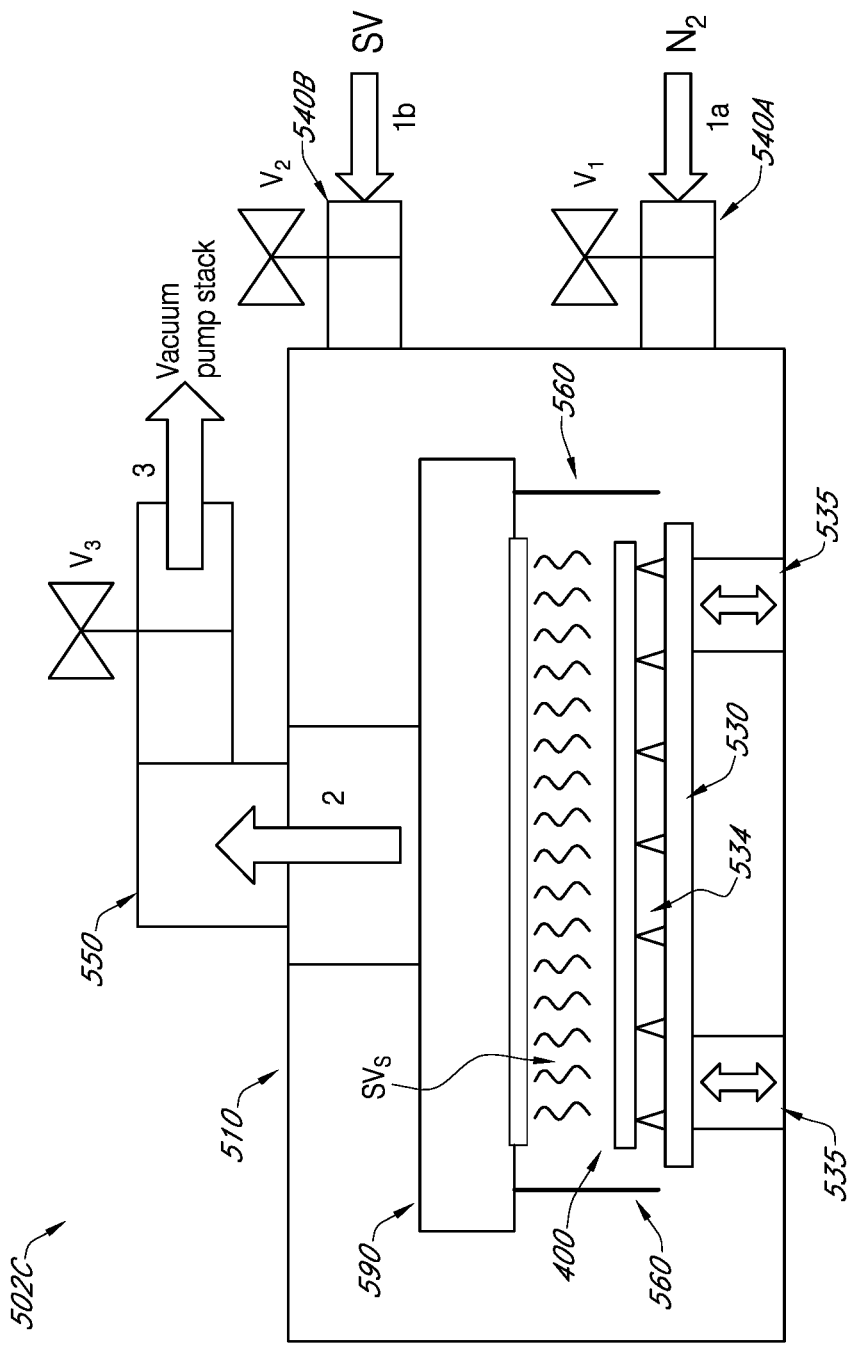

FIG. 3A through FIG. 3C are depictions of various embodiments of a drying module of the present teaching utilizing a showerhead. For various embodiments of a drying module as depicted in FIG. 3A through FIG. 3C, various showerhead designs can be readily interchanged, providing flexibility for process development. A showerhead design selected through process development for a specific process step can then be utilized in that specific manufacturing process step during production. In comparison to various embodiments of drying module 500A and 500B of FIG. 1A and FIG. 1B, respectively, a condensation plate of drying module 500A and 500B can be replaced by a showerhead design for embodiments of drying modules of FIG. 3A through FIG. 3C. Various embodiments of a drying module of the present teaching utilizing a showerhead can remove solvent vapors via evacuation ports connected to a vacuum pump stack. In various embodiments of a drying module configured with a showerhead, a combination of vacuum ports in flow communication with a vacuum source and gas ports in flow communication with a gas source can be configured on a showerhead. Accordingly, a gas flow from gas ports to vacuum ports (or equivalently, from gas outlet ports to gas inlet ports) in the vicinity of the surface of a showerhead can sweep away solvent vapors that can come in contact with the showerhead surface or which come within the vicinity of the showerhead surface. A showerhead can be configured in a number of ways to ensure that vapors can be uniformly removed. For example, a uniform arrangement of nozzles can be fabricated into a showerhead. Alternatively, a non-uniform arrangement of nozzles can be fabricated to intentionally compensate for edge effects that might occur at the edge of the substrate or at the edge of a coated region, in analogy to the discussion above with respect to FIG. 1C and FIG. 1D. For example, in certain regions where a reduced evaporation rate is desired relative to other areas, for example, in connection with the edge of the substrate or in connection with the uncoated regions in between coated regions on a substrate, a showerhead may be provided having a reduced area density of vacuum ports or having vacuum ports having a reduced aperture, and thereby reducing the flow of vapor into the showerhead in those regions. In various embodiments, a porous block material can be used to fabricate a showerhead providing uniform solvent removal.

FIG. 3A is a depiction of various embodiments of drying module 502A that can utilize showerhead 290 for providing uniform removal of solvent vapors $SV_S$ during a drying process for removal of a liquid ink from substrate 400. Various embodiments of drying module 502A as depicted in FIG. 3A can include showerhead 590 mounted within drying chamber 510, so as to be positioned above substrate support apparatus 530, which can be a substrate tray or a chuck. Substrate support apparatus 530 can be mounted on substrate support apparatus base 535, which can provide for height adjustment of substrate support apparatus 530 relative to showerhead 590. Various embodiments of substrate try 530 can have additional support structures 534 for supporting substrate 400. Upon substrate support apparatus 530, substrate 400 can be mounted as depicted in FIG. 3A.

Drying chamber 510 can have gas inlet port 540, which can have a gas in flow communication with drying chamber 510 controlled using valve $V_1$. In various embodiments of drying module 502A, valve $V_1$ can be a needle valve. According to the present teachings, a gas supplied via gas inlet port 540 can include, nitrogen clean dry air and argon. Additionally, a gas supplied via gas refill port 540 can be controlled to maintain a specified maximum amount of oxygen, moisture, ozone content, or a combination thereof. For example, a mixture of a saturated vapor and a carrier gas can be controlled to control the contamination of, for example, oxygen, water vapor, and ozone at less than about 100 parts per million (ppm), less than about 10 ppm, less than about 1 ppm, less than about 100 parts per billion (ppb), less than about 10 ppb, or less than about 1 ppb. Various embodiments of drying module 502A can be configured so that solvent vapors SV can be in flow communication with drying chamber 510 via solvent vapor inlet port 540B, which can be controlled using valve $V_2$. In various embodiments of drying module 501A, valve $V_2$ can be a needle valve. Showerhead 590 can be in flow communication with a vacuum pump stack through exhaust port 550. The flow of gas from chamber 510 via showerhead 590 through exhaust port 550 can be controlled using valve $V_3$. In various embodiments of drying module 502A, valve $V_3$ can be a throttle valve. In various embodiments of the drying modules or baking modules disclosed herein, the solvent vapor SV introduced into a process chamber can be the same, or substantially the same, as the solvent vapor $SV_S$ produced by evaporation of a liquid coating on a substrate 400 and alternatively, solvent vapor SV introduced into a process chamber can be different from the solvent vapor $SV_S$ produced by evaporation of a liquid coating on a substrate 400.

In addition to features of drying module 502A of the present teachings, embodiments of drying module 502B can include edge shields 560. For various embodiments of drying module 502B, edge shields 560 can provide a solvent hood that can prevent or greatly minimize solvent vapor diffusion that can occur at the edge of a substrate, as well as to prevent or greatly minimize inflow of gas at the edge of the showerhead. Additionally, various embodiments of a drying chamber utilizing a showerhead configured with edge shields can maximize solvent vapor capture by a showerhead. In addition to the features of drying module 502A and 502B, drying module 502C of FIG. 3C depicts embodiments of showerhead 590 of the present teaching that can be configured with porous plate 595. For such embodiments, it may be possible that solvent or solvent vapors can become entrapped within the pores of porous plate 595. Such solvent or solvent vapor entrapment in porous plate 595 can be addressed by, for example, the introduction of a heater (not shown) to heat porous plate 595. For example, during a cleaning or maintenance procedure, a porous plate could be heated to ensure effective removal of entrapped solvent or solvent vapors within the porous plate. For example, during a cleaning or maintenance procedure, porous plate 595 could be heated to ensure effective removal of entrapped solvent or solvent vapors within porous plate 595. In various embodiments, such heating of a porous plate can be combined with pulling vacuum through the porous plate to improve the efficiency of removal of entrapped solvent.

For various embodiments of any of a drying module 502A through 502C of FIG. 3A through FIG. 3C, respectively, substrate support apparatus 530 can be adjusted so as to establish a controllable distance gap G between showerhead 590 and substrate 400 According to the present teachings, for various embodiments of drying module 502A, during a drying process, gap distance G between showerhead 590 and substrate 400 can be between about 1 mm to about 100 mm. For various embodiments of drying module 500A, during a drying process, gap distance G between condensation plate 520 and substrate 400 can be between about 2 mm to about 50 mm. In various embodiments of any of a drying module 502A through 502C of FIG. 3A through FIG. 3C, respectively, a showerhead can be configured to be cooled or heated. In various embodiments of drying modules of FIG. 3A through FIG. 3C, the temperature of a showerhead can be controlled in a range between an ambient temperature and to about 200° C. For various embodiments of drying modules of FIG. 3A through FIG. 3C, the temperature of a showerhead can be controlled in a range between an ambient temperature and about 100° C. In various embodiments of drying modules of FIG. 3A through FIG. 3C, the temperature of a showerhead can be controlled in a range between an ambient temperature and about 60° C. For various embodiments of drying modules of FIG. 3A through FIG. 3C, the temperature of a showerhead can be controlled in a range between 10° C. to 60° C. According to the present teachings, an ambient temperature can be between about 15° C. to about 85° C.

Various embodiments of drying modules 502A through 502C of FIG. 3A through FIG. 3C, respectively, can be a configured to heat or cool substrate 400, similarly to the drying modules and baking modules described herein. In various embodiments, substrate holder 530 can be a chuck with integrated heating, cooling elements, or a combination thereof. In various embodiments of drying modules 502A through 502C, a remote heating element, such as an IR heater, can be used to heat substrate 400. Various embodiments drying modules 502A through 502C, are configured to control the temperature of substrate 400 to a temperature in a range between 10° C. to about 300° C. For various embodiments of drying modules 502A through 502C temperature control can provide substrate 400 at a temperature in a range between about −20° C. to about 80° C. Various embodiments drying modules 502A through 502C, are configured to control the temperature of substrate 400 to a temperature in a range between ambient and 200 C.

As previously described herein for various embodiments of drying modules of the present teachings, drying modules 502A through 502C as depicted in FIG. 3A through FIG. 3C, respectively, can be configured so that a vacuum pump stack can bring drying chamber 510 down to high vacuum, which can facilitate the efficient evaporation even for solvents having relatively high boiling points, for example, boiling points of 180° C. or higher. Further, various embodiments of drying modules 502A through 502C can utilize a vacuum pressure program configured to control a valve $V_3$ on gas outlet port 550 and valve $V_1$ on gas inlet port 540A by using a feedback pressure control loop (not shown). For various embodiments of a drying module drying modules 502A through 502C, valve $V_1$ can be a needle valve and valve $V_3$ can be a throttle valve. Various embodiments of drying modules 502A through 502C of FIG. 3A through FIG. 3B, respectively, can have a vacuum profile that can be programmed according to the requirements of a specific process. Various embodiments of drying modules 502A through 502C can have a control system for controlling the flow of solvent vapors SV into drying chamber 510. Such a control system can have a control sensor (not shown) configured to measure the solvent vapor SV in drying chamber 510, and a feedback system (not shown) for controlling valves $V_2$ on solvent vapor inlet port 540B and valve $V_3$ on gas outlet port 550 so as to establish a certain solvent vapor SV level in the drying chamber 510. For various embodiments of a drying module 501A, valve $V_2$ can be a needle valve and valve $V_3$ can be a throttle valve.

For various embodiments of a drying module depicted in FIG. 3A through FIG. 3C, the flexibility of modifying parameters such as the temperature difference between a substrate support apparatus and a showerhead, the gap between a substrate and a showerhead, the parameters of a vacuum pressure program, as well as adjusting the solvent vapor partial pressure over a substrate provide the flexibility for process development, as well as providing a set of fixed parameters for a manufacturing tool.

Table 5 summarizes operating parameters and related values that various embodiments of drying modules 502A, 502B and 502C may provide during the processing of a substrate.

As summarized in Table 5, for various embodiments of a drying module 502A, 502B, or 502C, an ink on a substrate can be dried via exposure to a reverse showerhead, in which a liquid content of an ink evaporates and can be pumped out of the module through a reverse showerhead. Various embodiments of drying module 502A, 502B, or 502C can be configured to achieve a base pressure of 1×10−6 Torr or less via a high vacuum pumping stack pumping an empty chamber for an extended period of time. Various embodiments of drying module 502A, 502B, or 502C can be configured to approach a max process vacuum of 1×10−5 Torr following drying of a substrate via a high vacuum pumping stack pumping on a chamber for a relatively short period of time, after a substrate is substantially dry, for example, for a time selected in a range of about 5 s to about 60 s; in various embodiments, for a time selected in a range of about 120 s to about 960 s. Various embodiments of drying module 502A, 502B, or 502C can be configured with a pressure control system for actively controlling the pressure to a certain set point pressure as a function of time (specified as a series of steps in a pressure program, each step specifying the pressure as a function of time over a certain period of time) over a set point range from ambient pressure down to 1 mTorr, and a pressure control system can establish an ambient pressure with an accuracy of ≤5±% of the set point.). As indicated in Table 5, various embodiments of drying modules 502A, 502B, or 502C can be configured to control a gap between a substrate and a reverse shower head over a range from 1 mm to 100 mm. Various embodiments of drying module 502A, 502B, or 502C can be configured to flow a solvent vapor SV into the drying chamber. The flow of solvent vapor SV can be controlled via a control system to establish a certain vapor pressure of solvent vapor SV in the chamber.

TABLE 5

Drying module parameters related to embodiments of drying modules 502A-502C

| | |
|---|---|
| Substrate Drying Mechanisms | Ambient Vacuum/Reverse Showerhead |
| Chamber Base Pressure | 1 × 10−6 Torr |
| Max Process Vacuum | 1 × 10−5 Torr |
| Vacuum control range | Ambient to 1 mTorr |
| Vacuum control accuracy (within vacuum control range) | +/−5% of set point |
| Vacuum Control Programming | Multi-Step Pressure/Hold program |
| Reverse Showerhead and Substrate Gap Control | Gap Control Range: 1 mm to 100 mm |
| Solvent Vapor Refill Option? | Yes |

Figure 4A:
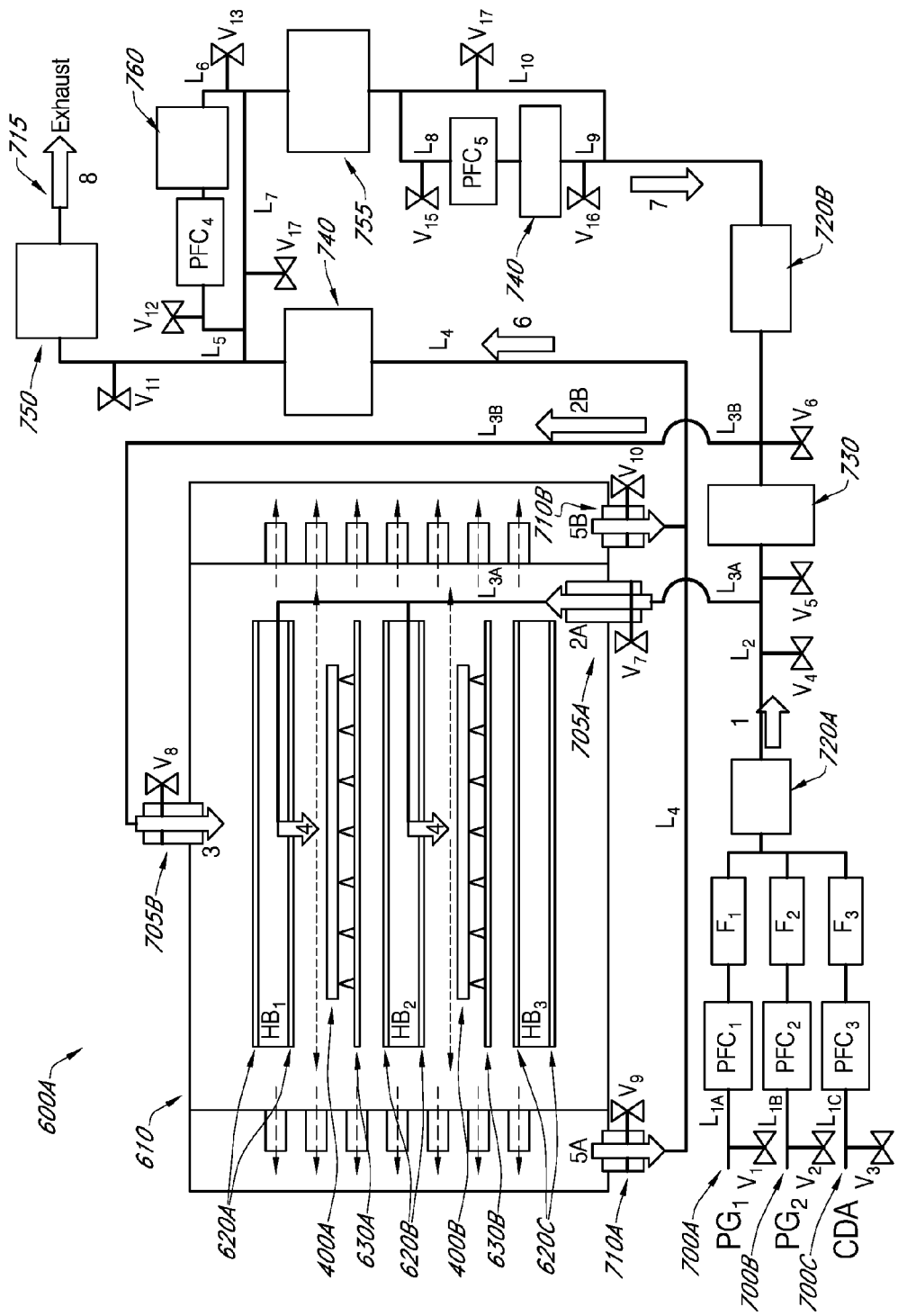
FIG. 4A is a schematic rendering that illustrates generally a various embodiments of a baking module of the present teachings.

FIG. 4A is a depiction of a various embodiments of a baking module according to the present teachings. For various embodiments of a baking module as depicted in FIG. 4A, the process environment of the baking module can be controlled to, for example, limit particulate levels using to an ultra-low level using a filtration system. For various baking modules, a low particle environment can be established, such as meeting International Standards Organization Standard (ISO) 14644-1:1999, "Cleanrooms and associated controlled environments—Part 1: Classification of air cleanliness," as specified by Class 1 through Class 5. For various embodiments of a baking module as depicted in FIG. 4, the process environment of the baking module can be controlled to be, for example, an inert gas environment. For various embodiments of an OLED device, an inert gas environment can be provided, for example, but not limited by a gas selected from nitrogen, any of the noble gases, and combinations thereof. In addition to an inert gas environment, in which reactive species can be controlled to a specified level, additional gas environments can include, a process environment of nitrogen and oxygen, for example, but not limited by, a process environment in which oxygen could be varied up to 20% (V/V) during process development.

Figure 4B:
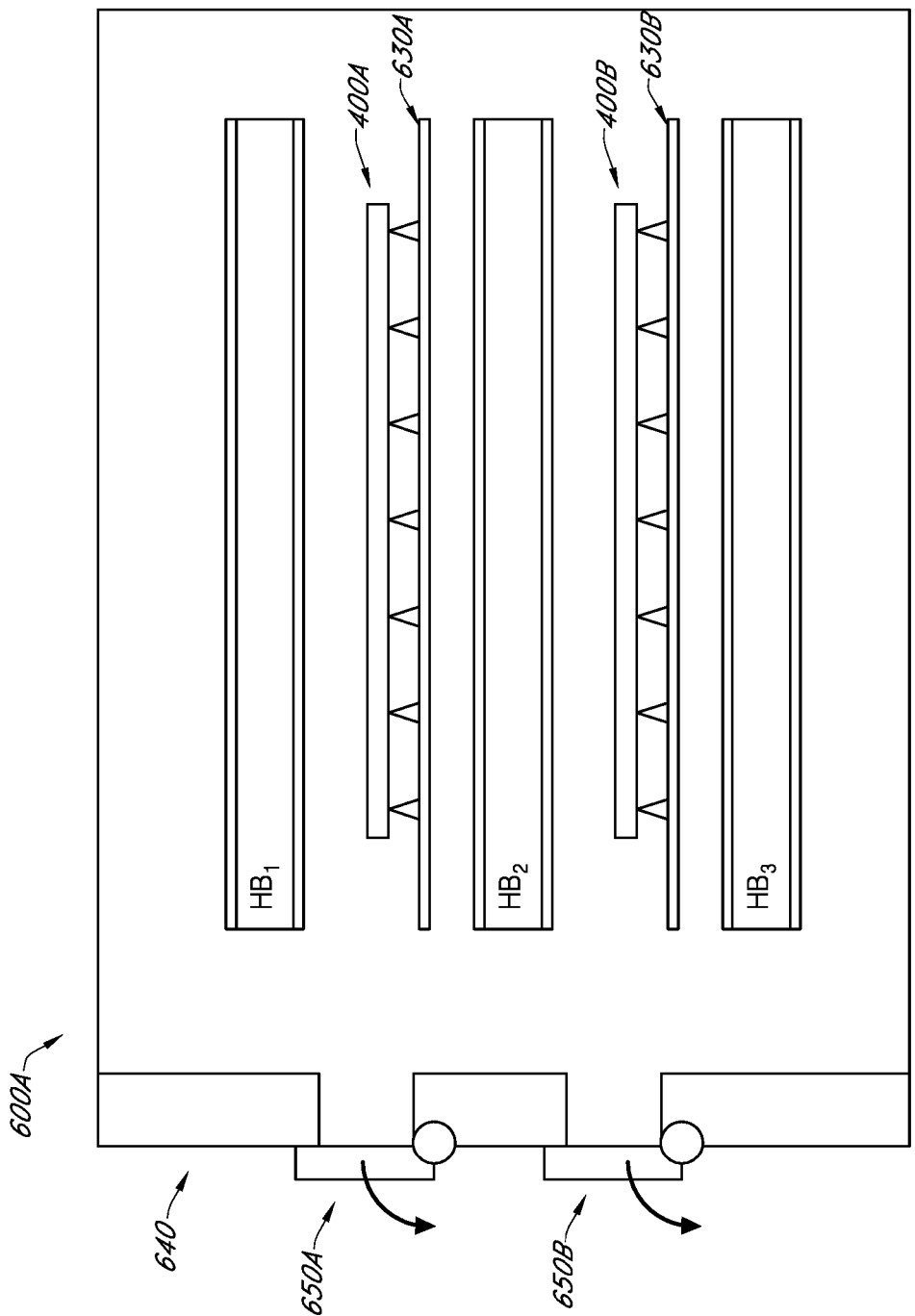
FIG. 4B is a side view of embodiments of a baking module as shown in FIG. 4A.

For various embodiments of baking module 600A of FIG. 4A, within chamber 610 a plurality of heater blocks, depicted in FIG. 4A as $HB_1$, $HB_2$ and $HB_3$, can be mounted in chamber 610 in a process stack capable of processing a plurality of substrates, depicted in FIG. 4A as 400A and 400B. In various embodiments of baking module 600A, heater blocks, depicted in FIG. 4A as $HB_1$, $HB_2$ and $HB_3$, can reach a maximum temperature of 350° C. In various embodiments pairs of heat spreading plates, depicted in FIG. 4A as 620A, 620B, and 620C, can be configured on each heater block, and as depicted in FIG. 4A, each of a spreading plate from each of two neighboring heater blocks can be above and below substrate a support apparatus, depicted in FIG. 4A as 630A and 630B, where each substrate support apparatus occupies a process sub-chamber or slot within baking module 600A. As shown in FIG. 4B, which is as side view of baking module 600A of FIG. 4A, various embodiments of baking module 600A of the present teachings can have front panel 640 with discrete slit valves, depicted in FIG. 4A as 650A and 650B, configured so that when open a substrate, such as substrate 400A and 400B of FIG. 4B, can be loaded and unloaded onto a particular slot upon a substrate support apparatus, such as substrate support apparatus 630A and 630B of FIG. 4B, without substantially affecting the temperature of a substrate in another location.

In various embodiments of baking module 600A of FIG. 4A and FIG. 4B, the heat spreading plates can be heated by one or more associated heater blocks. In various embodiments of baking module 600A of FIG. 4A and FIG. 4B, the heater blocks can be comprised of multiple heating elements, each such heating element delivering heat to a particular region of the heat spreader plates. In various embodiments of baking module 600A of FIG. 4A and FIG. 4B, the heat spreader plates distribute the heat from the one or more heater blocks resulting in a more uniform temperature distribution. Various embodiments of baking module 600A of FIG. 4A and FIG. 4B can be configured to uniformly heat the substrate with a variation in temperature over the substrate area that less than ±10% of the mean substrate temperature, ±5% of the mean substrate temperature, ±2% of the mean substrate temperature, or ±1% of the mean substrate temperature.

For various embodiments of baking module 600A of FIG. 4A and FIG. 4B of the present teachings, high purity gas $PG_1$ can be controllable flow communication with baking chamber 610 via process gas inlet port 700A, as well as via baking chamber inlet ports 705A and 705B. In various embodiments of baking module 600A of FIG. 4A and FIG. 4B, high purity process gas $PG_1$ can be first purified to minimize contamination of certain reactive species, for example, oxygen, water vapor, or ozone, so that the levels of each reactive species is less than, for example, than between about 1 ppb to about 100 ppm. According to the present teachings, and as indicated by the bidirectional hatched lines depicted in FIG. 4A, baking module 600A can be configured to recirculate a process gas from the sides of each sub-chamber or slot in which a substrate is located. As depicted in by the numbered 2-D flow arrows of FIG. 4A that trace the flow of process gas through baking chamber 610, process gas can flow from baking chamber 610 through chamber outlet ports 710A and 710B, with a recirculating return path back into the chamber via baking chamber inlet ports 705A and 705B. In various embodiments, a baking chamber is configured to operate in an inert gas environment, for example, a nitrogen or noble gas environment, such as argon, or a combination of nitrogen and a noble gas.

In various embodiments of baking module 600A of FIG. 4A and FIG. 4B, a baking chamber is configured to operate with additional high-purity process gas sources having, for example, a low concentration of certain contaminant species, such as ozone or water vapor. For example, high-purity process gas $PG_2$ can be a high purity oxygen source having a low concentration of ozone or water vapor. High-purity process gas $PG_2$ can be in flow communication with baking chamber 610 via process gas inlet port 700B, as well as via baking chamber inlet ports 705A and 705B. In various embodiments, a process gas is recirculated into a baking chamber via an inlet port. Similarly, high-purity clean dry air (CDA) can have a low concentration of ozone or water vapor. Clean dry air can be in flow communication with baking chamber 610 via process gas inlet port 700C, as well as via baking chamber inlet ports 705A and 705B.

For various embodiments of baking chamber 600A of the present teachings, it can be desirable to maintain a generally downward flow of a process gas in a module so as to drive particles in a module towards the bottom of a chamber and avoid directing those particles onto a substrate. In various embodiments, accordingly a process gas can be recirculated into baking chamber 610 via baking chamber inlet port 705B located in the top half of baking chamber 610. In various embodiments, accordingly a process gas can be recirculated out of a baking chamber via first outlet port 710A and 710B depicted in FIG. 4A in the bottom half of baking chamber 610. In various embodiments, a process gas is recirculated into a baking chamber and distributed via various fluidic systems including lines, manifolds, flow splitters, valves, and the like. For example, in FIG. 4A, a process gas can be in flow communication with baking chamber 610 through line $L_2$ and then split into chamber process gas lines $L_{3A}$ and $L_{3B}$, which gas flow into baking chamber 610 can be controlled by valves $V_1$ through $V_3$. As depicted in FIG. 4A, a process gas can be recirculated through heater block $HB_1$, $HB_2$ and $HB_3$ or heat spreader plates 620A, 620B, and 620C above each substrate tray 630A and 630B and then directed down onto the substrate trays 630A and 630B so as to effect a flow of process gas from the center of each substrate tray 630A and 630B to the edges of each substrate tray 630A and 630B. When a substrate, such as substrates 400A and 400B of FIG. 4A, is loaded into a slot in baking chamber 610, the resulting flow of process gas as depicted in FIG. 4A, would be from the center of each substrate to the edges. In various embodiments, the process gas can be heated by heater blocks $HB_1$, $HB_2$ and $HB_3$ or the heat spreading plates 620A, 620B, and 620C, up to a specified process temperature so that upon flowing out of the heater blocks or heat spreader plates and down onto a substrate, the process gas can be substantially at the target substrate temperature within a specified variance for the process. In various embodiments of baking module 600A, a process gas that flows down onto the substrate can provided via one port, such as baking chamber inlet port 705B. According to the present teachings, such an inlet port, such as baking chamber inlet port 705B of FIG. 4A, can be positioned substantially in the center region of the substrate positions within baking chamber 610. In various embodiments of baking module 600A, a process gas that flows down onto a substrate can be provided via multiple ports substantially in the center region of the substrate positions within baking chamber 610. In various embodiments, the gas that flows down onto a substrate can be provided via multiple ports distributed over the substrate positions within baking chamber 610.

In various embodiments of baking modules of the present teachings, a process gas can be circulated through baking chamber 610 of FIG. 4A at a pressure that is similar to or greater than the ambient pressure inside the baking module process chamber, such as baking chamber 610 of baking module 600A. In various embodiments baking modules, a process gas can be circulated through a baking chamber at a pressure that is substantially above the ambient pressure inside the baking module, so that the relatively elevated pressure of the process gas provides for sufficient process flow through baking chamber as previously described herein. In various embodiments of baking modules of the present teaching, the process gas provided to flow over a substrate surface can provided at a specified pressure that is at least between about 10 psi to about 160 psi greater than the ambient pressure inside a baking chamber, such as baking chamber 610 of FIG. 4A. In various embodiments of baking module 600A, such gas at an elevated pressure (relative to ambient) can be supplied directly by an external gas source, for example, from sources $PG_1$, $PG_2$, or CDA through gas inlets 700A, 700B, and 700C respectively that originates at a relatively high pressure which is reduced to a target supply pressure via pressure regulator (for example, pressure or flow control module $F_1$, $F_2$, or $F_3$). In various embodiments, such relatively high pressure gas can be supplied via the gas recirculation system whereby recirculated gas at ambient pressure is directed through valve $V_6$ into pressure accumulation module 730 which is configured to collect gas from the recirculation system into an accumulation chamber utilizing a pump so as to produce a supply of recirculated gas at the target supply which can then be directed through valve $V_5$ into inlet port 705A.

In various embodiments of baking module 600A, the pressure or flow can be controlled via a flow control module (not shown), for example, a flow control module including a gas flow sensor coupled to an adjustable butterfly or needle valve via control electronics, or pressure control module not shown) on line $L_{3A}$, for example, a pressure control module including a pressure sensor coupled to an adjustable pressure regulator via control electronics, to establish a specific flow rate onto a substrate. In various embodiments, a process gas can be provided into a baking chamber via an external gas supply, and such process gas is provided into the main body of a baking chamber.

For various embodiments of baking modules of the present teachings, a process gas can be thermally regulated according to various system requirements.

For example, in various embodiments of a baking module of the present teachings, a process gas can be directed through a gas heating module prior to introduction into a baking chamber. For example, any source of process gas depicted in FIG. 4A for process module 600A, can be passed through a process gas heater before entering baking chamber 610. According to various embodiments of baking module 600A, process gas heating apparatus 720A, can heat a process gas from a process gas source, as well as heating a recirculating process gas with process gas heating apparatus 720B; both of which heat a process gas before the process gas enters baking chamber 610. For various embodiments of baking module 600A, process gas heating apparatus 720A and 720B can heat a process gas to a temperature that is greater than about 100° C. prior to introduction into the baking chamber. In various embodiments of baking module 600A, process gas heating apparatus 720A and 720B can heat a process gas to a temperature that is greater than about 200° C. prior to introduction into the baking chamber. For various embodiments of baking module 600A, process gas heating apparatus 720A and 720B can heat a process gas to a temperature that is greater than about 300° C. prior to introduction into the baking chamber.

Further, after a process gas flows out of a baking chamber through the one or more outlet ports the gas can be directed through a gas cooling module. As depicted in FIG. 4A, a process gas can flow out of process chamber 610 via process gas outlet ports 710A and 710B, and into return line L4, and then directed through gas cooling apparatus 740. Gas cooling apparatus 740 can cool a process gas to below a certain target temperature. As depicted in FIG. 4A, a gas can be directed through gas cooling apparatus 740 before being directed into gas heating apparatus 720B. In FIG. 4A, in the flow path between gas cooling apparatus 740 and gas heating apparatus 720B, a gas purification apparatus 760 and gas filtration apparatus 770 are depicted. Given the operating conditions required for various gas purification modules and particle filtration modules, which can be incompatible or inefficient when operating at very high temperatures; it can be desirable to cool the gas below a certain temperature to facilitate the purification and filtration functions. According to various embodiments of baking module 600A of FIG. 4A, gas cooling apparatus 740 can cool a process gas to less than about 100° C. For various embodiments of baking module 600A of FIG. 4A, gas cooling apparatus 740 can cool a process gas to less than about 50° C. In various embodiments of baking module 600A of FIG. 4A, gas cooling apparatus 740 can cool a process gas to less than about 30° C. In various embodiments of baking module 600A, blower or exhaust pump 750 can be provided in an exhaust line in flow communication with baking chamber 610 to drive the flow of gas to an exhaust via exhaust port 715.

For various embodiments of baking module 600A, a process gas can be passed through a particle filter apparatus or a purification apparatus to provide for reduced particles or enhanced chemical purity. In various embodiment of baking module 600A, gas purification apparatus 760 and blower or recirculating pump 755 are positioned upstream from particle filtration apparatus 770, so that particles generated within gas purification apparatus 760 or blower or recirculating pump 755 can be more efficiently captured by particle filtration apparatus 770 prior to the recirculated process gas entering baking chamber 610. In various embodiments of baking module 600A, blower or recirculation pump 755 can provide sufficient flow of a process gas throughout the circulation system, as well as provide sufficient flow of a process gas through the baking chamber.

In various embodiments, during process gas circulation, a process gas can be circulated through gas purification branch including line $L_5$ controlled by valve $V_{12}$ and $L_6$ controlled by valve $V_{13}$, which can control the flow of a process gas such that a portion of the recirculated process gas flows through gas purification apparatus 760 at a given time. In various embodiments, less than 10%, less than 20%, or less than 50% of the recirculated gas flow can directed through gas purification apparatus 760 at a given time. In various embodiments, substantially all of the recirculated gas flowing through the recirculation loop through gas purification apparatus 760 at a given time. In various embodiments, gas purification apparatus can be configured to remove impurities and reactive species from a process gas, such as oxygen, moisture, and ozone. For example, gas purification apparatus 760 can remove impurities and reactive species, such as oxygen, water vapor, and ozone, as well as various solvent vapors resulting in the process gas stream as a result of processing a substrate, to less than about 100 parts per million (ppm), less than about 10 ppm, less than about 1 ppm, less than about 100 parts per billion (ppb), less than about 10 ppb, or less than about 1 ppb. In various embodiments, gas purification apparatus is configured with a chemical filter, a mechanical filter, or a cold trap, or combinations thereof, for removing impurities and reactive species.

In various embodiments, during process gas circulation, a process gas can be circulated through gas filtration branch including line $L_8$ controlled by valve $V_{15}$ and $L_9$ controlled by valve $V_{16}$, which can control the flow of a process gas such that a portion of the recirculated process gas flows through gas filtration apparatus 770 at a given time. In various embodiments, less than 10%, less than 20%, or less than 50% of the recirculated gas flow can be directed through gas filtration apparatus 770 at a given time. In various embodiments, substantially all of the recirculated gas flowing through the recirculation loop can be directed gas filtration apparatus 770 at a given time. In various embodiments, the amount of gas flow gas filtration apparatus 770 can be actively controlled by a flow control module (not shown). In various embodiments of a flow control module, the amount of gas flow directed into a gas purification branch can be established by the relative resistance to flow along each branch in the recirculation system, for example, as a result of the diameter of the piping or any apertures along each line in a branch, as well as the pressure drops across any elements, such as, for example, filtering elements. In various embodiments of baking module 600A, gas flow gas filtration apparatus 770 can be configured with a filter such a HEPA or ULPA filtration unit.

Figure 4C:
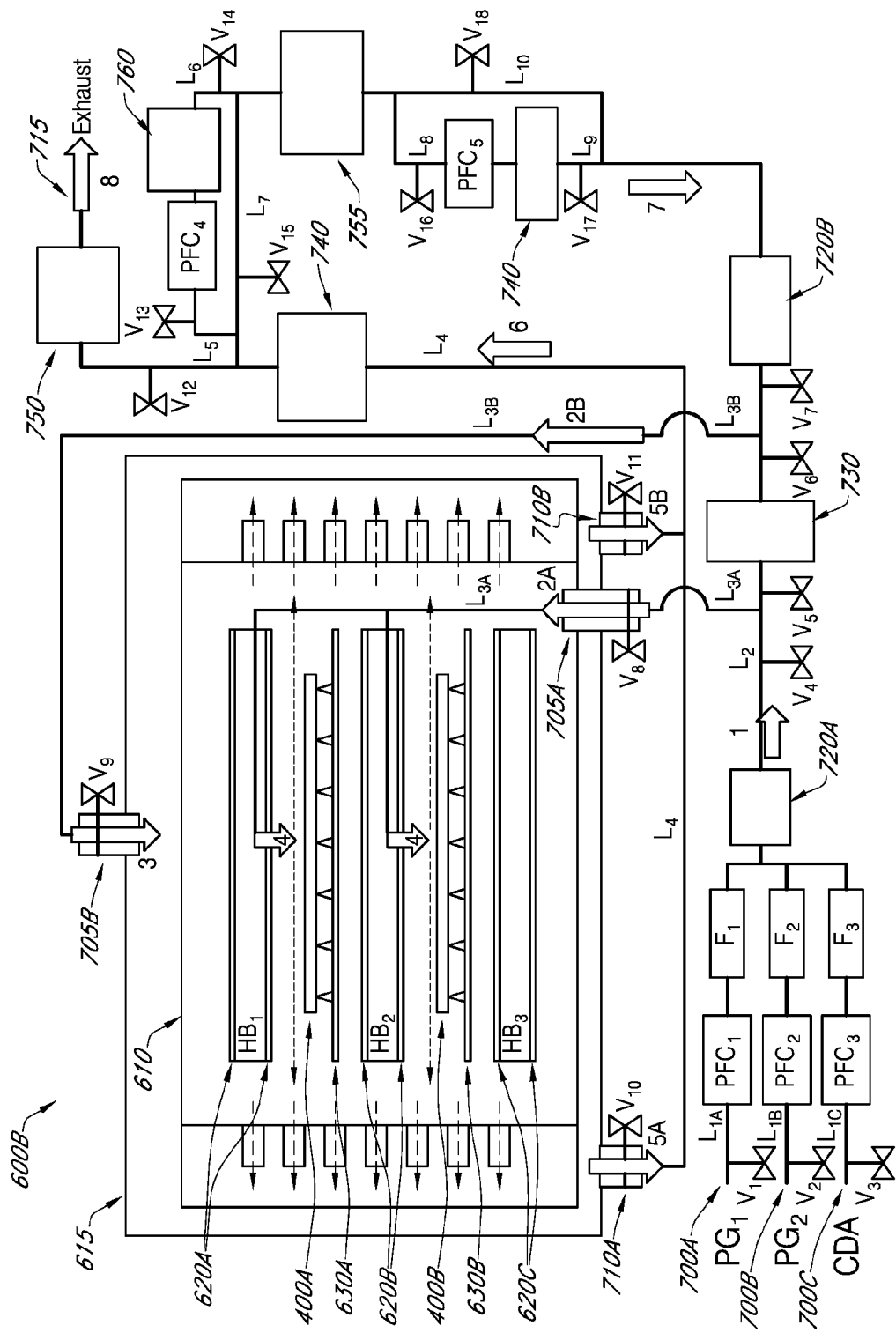
FIG. 4C is a schematic rendering that illustrates generally various embodiments of a baking module of the present teachings.

FIG. 4C depicts embodiments of baking module 600B according to the present teachings. Baking module 600B can have all of the features as recited previously herein for baking module 600A of FIG. 4A and additionally, can have a secondary enclosure around a baking module, for example, such as secondary baking chamber enclosure 615, which is depicted in FIG. 4C as enclosing baking chamber 610. For various embodiments of a baking module of the present teachings, a baking chamber may not be sufficiently hermetically sealed to support maintaining a process gas environment with sufficiently low levels of certain contaminant species. For example, various embodiments a baking module of the present teachings may not have sufficient sealing to support maintaining the process gas environment of various baking modules of the present teachings at a specified purity level. For example, the process gas environment of various embodiments of a baking module of the present teachings can limit various impurities and reactive species, such oxygen, water vapor, or ozone, to contamination levels of less than, for example 1000 ppm, for example, less than 1 ppm, or for example, less than 1 ppb.

In such a case, it can be desirable to introduce a secondary enclosure around the internal baking module that provides for a sufficiently sealed environment. According to various embodiments of the present teachings, a process gas can be circulated through secondary baking chamber enclosure 615. For example, any of the process gases depicted in FIG. 4C or any combination thereof can flow through process gas line $L_2$ and be routed through process line $L_{3B}$ to can have a process gas circulated through secondary baking chamber inlet port 705B, thereby flowing through secondary baking chamber enclosure 615. In various embodiments, in addition to inlet port 705B as shown in FIG. 4C a baking module can be further configured to include another similar inlet port connected to line $L_{3B}$ that supplies process gas directly into the baking chamber 610, as is provided in FIG. 4A. In various embodiments, the top of internal chamber 610 can be provided with apertures, slits, or perforations to provide for the downward flow of gas from inlet port 705B into chamber 610. A process gas can be circulated out of secondary baking chamber enclosure 615 via baking chamber outlet port 710A and baking chamber outlet port 710B. With respect to the use of slit valves in connection with substrate slot for substrate loading and unloading, as described in FIG. 4C, in various embodiments of process module 600B, the slide valves can be provided as part of the secondary enclosure and the front of the internal baking module can be left open so as to provide free access (through the slit valves) to the substrate slots. In various embodiments, in addition to outlet ports 710A and 710B as shown in FIG. 4C a baking module can be further configured to include another set of similar outlet ports connected to line $L_4$ that receive process gas directly from the baking chamber 610, as is provided in FIG. 4A. In various embodiments, the bottom of the peripheral cavities of internal chamber 610 can be provided with apertures, slits, or perforations to provide for the downward flow of gas cycled from the center of the baking chamber into the side peripheral cavities and then out of baking module through outlet ports 710A and 710B.

In addition to providing an inert gas environment, various embodiments of baking module, such as baking modules 600A and 600B of the present teachings as depicted in FIG. 4A through FIG. 4C can be configured with a gas purification system capable of limiting reactive species that can degrade various materials used in OLED device fabrication. Such reactive species can include, for example, but not limited by, water vapor, oxygen, and ozone, as well as various organic solvent vapors of solvents used in various inks during the manufacturing of various OLED devices. Various embodiments of a baking module depicted in FIG. 4A through FIG. 4C can have a gas purifier that can be selectively used depending on the nature of the process gas environment desired.

Table 6 summarizes operating parameters and related values that various embodiments of baking modules 600A and 600C may provide during the processing of a substrate.

As summarized in Table 6, various embodiments of baking modules 600A and 600C can be configured with between 2 and 20 slots into which substrate can be simultaneously placed for thermal treatment. Various embodiments of baking modules 600A and 600C can be provided such that the main chamber material is stainless steel. Various embodiments of baking modules 600A and 600C can be configured to operate with a process environment consisting of purified nitrogen, purified clean dry air, or a specified mixture of nitrogen and oxygen. Various embodiments of baking modules 600A and 600C can be configured to heat a substrate placed into a particular slot from ambient up to 350° C., with a temperature accuracy of ≤±3° C. with respect to the mean temperature (as averaged over the substrate area), and a temperature uniformity of ≤±2% around the mean temperature (as averaged over the substrate area) over the substrate area.

TABLE 6

Baking module parameters related to embodiments of baking modules 600A and 600C

| | |
|---|---|
| Number of Slots | 2 to 20 |
| Chamber material | Stainless Steel |
| Process Environment | Purified $N_2$ or $N_2$:$O_2$ mix |
| Max Temperature | 350° C. |
| Temperature Accuracy | ±3° C. |
| Temperature Uniformity (over substrate area) | ±2% around mean |

While the principles of this invention have been described in connection with specific embodiments, it should be understood clearly that these descriptions are made only by way of example and are not intended to limit the scope of the invention. What has been disclosed herein has been provided for the purposes of illustration and description. It is not intended to be exhaustive or to limit what is disclosed to the precise forms described. Many modifications and variations will be apparent to the practitioner skilled in the art. What is disclosed was chosen and described in order to best explain the principles and practical application of the disclosed embodiments of the art described, thereby enabling others skilled in the art to understand the various embodiments and various modifications that are suited to the particular use contemplated. It is intended that the scope of what is disclosed be defined by the following claims and their equivalence.

What is claimed is:

1. A method for processing a substrate comprising:
coating a liquid ink on a substrate, wherein the liquid ink is a formulation comprising a carrier liquid and a film-forming material;
positioning the substrate in a drying chamber of a drying module, wherein the drying chamber comprises
a substrate support apparatus for supporting the substrate,
a condensation plate positioned above the substrate support apparatus, wherein a surface of the condensation plate opposing the substrate is configured to provide at least two gap distances between the surface of the condensation plate opposing the substrate and the substrate, and
wherein a first gap distance of the at least two gap distances is positioned over a first area on the substrate, and a second gap distance of the at least two gap distances is positioned over a second area on the substrate;
applying a vacuum to the drying chamber; and
drying the substrate in the drying chamber;
wherein the method further comprises before or during drying the substrate, controlling the temperature of the substrate and the condensation plate; and
wherein the temperature of the condensation plate is controlled in a range of between about −10° C. to about 15° C.

2. The method of claim 1, wherein a controlled temperature of the substrate is maintained relative to a controlled temperature of the condensation plate.

3. The method of claim 2, wherein the controlled temperature of the substrate is maintained at a higher temperature than the controlled temperature of the condensation plate.

4. The method of claim 1, wherein controlling the temperature of the substrate is done by controlling the temperature of the substrate support apparatus.

5. The method of claim 1, wherein controlling the temperature of the substrate is done by controlling a remote heating method.

6. The method of claim 1, wherein the remote heating method is a method using an infra-red source for heating the substrate.

7. The method of claim 1, wherein the temperature of the substrate is controlled in a range of between about 40° C. to about 300° C.

8. The method of claim 1, wherein the first region of the substrate that has a carrier liquid vapor concentration that is uniform over the first region.

9. The method of claim 8, wherein the first gap between the condensation plate and the first region of the substrate is about 1 millimeter to about 20 millimeters.

10. The method of claim 1, wherein the vacuum applied to the drying chamber during drying is less than or equal to about $1 \times 10^{-5}$ Torr.

11. The method of claim 1, wherein the drying module further comprises edge shields positioned proximal to the substrate.

12. A method for processing a substrate comprising:
coating a liquid ink on a substrate, wherein the liquid ink is a formulation comprising a carrier liquid and a film-forming material;
positioning the substrate in a drying chamber of a drying module, wherein the drying chamber comprising
a substrate support apparatus for supporting the substrate,
a condensation plate positioned above the substrate support apparatus, wherein a surface of the condensation plate opposing the substrate is configured to provide at least two gap distances between the surface of the condensation plate opposing the substrate and the substrate, and
wherein a first gap distance of the at least two gap distances is positioned over a first area on the substrate, and a second gap distance of the at least two gap distances is positioned over a second area on the substrate;
applying a vacuum to the drying chamber;
drying the substrate in the drying chamber;
wherein the second region of the substrate has a carrier liquid vapor concentration that is non-uniform over the second region.

13. The method of claim 12, wherein the second gap between the condensation plate and the second region of the substrate is greater than the first gap by at least 1 millimeter.

14. The method of claim 12, further comprising before or during drying the substrate, controlling the temperature of the substrate and the condensation plate.

15. The method of claim 14, wherein a controlled temperature of the substrate is maintained relative to a controlled temperature of the condensation plate.

16. The method of claim 15, wherein the controlled temperature of the substrate is maintained at a higher temperature than the controlled temperature of the condensation plate.

17. The method of claim 14, wherein controlling the temperature of the substrate is done by controlling the temperature of the substrate support apparatus.

18. The method of claim 14, wherein controlling the temperature of the substrate is done by controlling a remote heating method.

19. The method of claim 14, wherein the remote heating method is a method using an infra-red source for heating the substrate.

20. The method of claim 14, wherein the temperature of the substrate is controlled in a range of between about 40° C. to about 300° C.

21. The method of claim 14, wherein the temperature of the condensation plate is controlled in a range of between about −10° C. to about 15° C.

22. The method of claim 12, wherein the first region of the substrate that has a carrier liquid vapor concentration that is uniform over the first region.

23. The method of claim 22, wherein the first gap between the condensation plate and the first region of the substrate is about 1 millimeter to about 20 millimeters.

24. The method of claim 12, wherein the vacuum applied to the drying chamber during drying is less than or equal to about $1 \times 10^{-5}$ Torr.

25. The method of claim 12, wherein the drying module further comprises edge shields positioned proximal to the substrate.

* * * * *